(12) United States Patent
Nose et al.

(10) Patent No.: US 7,508,054 B2
(45) Date of Patent: Mar. 24, 2009

(54) SEMICONDUCTOR DEVICE AND A METHOD OF MANUFACTURING THE SAME

(75) Inventors: Fujiaki Nose, Ome (JP); Hiroshi Kikuchi, Hidaka (JP); Satoshi Ueno, Ome (JP); Norio Nakazato, Kashiwa (JP)

(73) Assignee: Hitachi, Ltd., Tokyo (JP)

( * ) Notice: Subject to any disclaimer, the term of this patent is extended or adjusted under 35 U.S.C. 154(b) by 532 days.

(21) Appl. No.: 11/153,359

(22) Filed: Jun. 16, 2005

(65) Prior Publication Data

US 2005/0233501 A1    Oct. 20, 2005

Related U.S. Application Data

(63) Continuation of application No. 10/621,411, filed on Jul. 18, 2003, now Pat. No. 6,924,549.

(30) Foreign Application Priority Data

Aug. 29, 2002   (JP)   ............................. 2002-250506

(51) Int. Cl.
  *H01L 23/495*   (2006.01)
(52) U.S. Cl. .............................. 257/667; 257/E23.047; 257/666; 257/668; 257/675; 438/111; 438/112; 438/123; 29/827
(58) Field of Classification Search .......... 257/E23.037, 257/E23.04, E23.047, E23.124, E23.144, 257/666, 668, 758, 676, 675, 667; 438/123, 438/124, 127, 111, 112, FOR. 371, FOR. 377, 438/FOR. 366, FOR. 369; 29/827
See application file for complete search history.

(56) References Cited

U.S. PATENT DOCUMENTS

| | | | | |
|---|---|---|---|---|
| 5,291,059 | A | | 3/1994 | Ishitsuka et al. ............. 257/666 |
| 5,378,656 | A | * | 1/1995 | Kajihara et al. ............... 29/827 |
| 5,428,248 | A | | 6/1995 | Cha ........................... 257/676 |
| 5,436,500 | A | | 7/1995 | Park et al. .................... 257/696 |
| 6,020,625 | A | * | 2/2000 | Qin et al. ..................... 257/666 |
| 6,028,350 | A | | 2/2000 | Sabyeying .................. 257/670 |
| 6,157,074 | A | * | 12/2000 | Lee ............................. 257/666 |
| 6,208,023 | B1 | * | 3/2001 | Nakayama et al. .......... 257/696 |
| 6,727,590 | B2 | | 4/2004 | Izumitani et al. ............ 257/758 |

FOREIGN PATENT DOCUMENTS

JP        07-147352        6/1995

* cited by examiner

*Primary Examiner*—Chris C. Chu
(74) *Attorney, Agent, or Firm*—Miles & Stockbridge P.C.

(57) ABSTRACT

Means for forming a package is disclosed on which is mounted a semiconductor chip with a high-speed LSI formed thereon, using a wire bonding method. The package comprises a semiconductor chip, a die pad smaller than a main surface of the semiconductor chip, a sealing member, plural leads each comprising an outer terminal portion and an inner lead portion, and plural bonding wires for connection between bonding pads formed on the semiconductor chip and the inner lead portions of the leads, each of the inner lead portions being bent in a direction away from a mounting surface of the sealing member, thereby approximating the height of the chip-side bonding pads and that of a bonding position of the inner lead portions to each other, whereby the wire length can be made shorter and it is possible to suppress an increase in inductance of the wire portions and attain impedance matching at various portion of a high-frequency signal input/output transmission path.

6 Claims, 26 Drawing Sheets

11 : FIRST-LAYER WIRING (FIRST WIRING)
14A : FOURTH-LAYER WIRING (FOURTH WIRING)

11 : FIRST-LAYER WIRING (FIRST WIRING)
14A : FOURTH-LAYER WIRING (FOURTH WIRING)

WIRE INDUCTANCE : 1nH

| No. | L | VSWR (≦12GHz) | TRANSMISSION LOSS (≦12GHz) | DECISION | REASON |
|---|---|---|---|---|---|
| ① | 0 μm | 2.7 | −0.1dB | × | LARGE VSWR |
| ② | 50 μm | 2.4 | −0.3dB | ○ | MOST SUITABLE |
| ③ | 100 μm | 2.1 | −0.5dB | × | LARGE LOSS |

40 : QFN (SEMICONDUCTOR DEVICE)
41a : DIE PAD
41b : INNER LEAD PORTION
41c : OUTER TERMINAL PORTION
41d : LEAD
42 : SEMICONDUCTOR CHIP
42a : MAIN SURFACE
42b : BACK SURFACE
42c : BONDING PAD (ELECTRODE)
43 : SEALING MEMBER
43a : MOUNTING SURFACE
43b : SURFACE (OPPOSITE SIDE)
44 : BONDING WIRE

41 : LEAD FRAME

50 : QFN (SEMICONDUCTOR DEVICE)

51 : HEAT RADIATION FIN (HEAT SINK)

41i : OUTER LEAD (OUTER TERMINAL PORTTION)
43c : SIDE FACE
52 : QFP (SEMICONDUCTOR DEVICE)

SEMICONDUCTOR DEVICE AND A METHOD OF MANUFACTURING THE SAME

CROSS-REFERENCE TO RELATED APPLICATION

This application is a continuation of Application No. 10/621,411 filed Jul. 18, 2003 now U.S. Pat. No. 6,924,549.

BACKGROUND OF THE INVENTION

The present invention relates to a semiconductor device. Particularly, the invention is concerned with a technique applicable effectively to a semiconductor device for which are required signal transmission at a high frequency and high-speed signal transmission in a wide frequency band.

For a package on which is mounted a semiconductor chip with high-speed LSI formed thereon such as IC for optical communication there is required signal transmission of a broad band from DC up to an actually-used high frequency band. Particularly, at a bit rate of 10 Gbits/sec or more, both impedance matching at a high frequency and a low loss are required for such a package as referred to above. To meet such requests it may be effective to adopt means wherein a semiconductor chip is mounted by face-down method onto a main surface of a package substrate with signal transmission lines formed thereon and one ends of the signal transmission lines are extended up to just under electrode pads formed on the main surface of the semiconductor chip, thereby connecting the signal transmission lines and the electrode pads with each other electrically through bump electrodes. According to this means, the signal transmission lines and the semiconductor chip can be connected together at a shortest distance, so that transmission characteristics from the signal transmission lines to the electrode pads on the semiconductor chip can be maintained in a satisfactory condition. By using a ceramic material as a packaging material it is possible to form impedance-matched transmission lines of a low signal loss. Moreover, by making hermetic seal with use of a ceramic material as a packaging material it is possible to protect the semiconductor chip from the external environment and realize a package superior in all of mechanical strength, moisture resistance, heat resistance, and heat dissipating characteristic.

For example in Japanese Unexamined Patent Publication No. Hei 7(1995)-147352 there is disclosed a technique in which the width of a signal transmission line formed on a package substrate is narrowed in an area overlapping a semiconductor chip to compensate a lowering of impedance which is attributable to a capacitance formed between the semiconductor chip and the signal transmission lines, thereby attaining a characteristic impedance matching of the signal transmission lines in the package. Also disclosed therein is a technique which uses a ceramic package substrate to diminish a loss of transmission signal in the package.

SUMMARY OF THE INVENTION

In case of mounting a semiconductor chip by a face-down method onto a main surface of such a package substrate as described above it is necessary to form bump electrodes (solder balls) on electrode pads formed on the chip main surface. For example, the bump electrodes are formed by forming a photoresist film on a main surface of a semiconductor wafer prior to cutting into individual chips, followed by patterning and subsequent formation of bump electrodes on electrode pads in accordance with a plating method or any other suitable method. Consequently, the number of processing steps for the semiconductor wafer increases in comparison with means wherein electrode pads and a package substrate are subjected to wire bonding for mounting. Thus, the semiconductor wafer manufacturing cost becomes high.

Moreover, since the semiconductor chip is mounted by a face-down method, connections between the bump electrodes and the package substrate become invisible in the mounting process. Consequently, it becomes difficult to effect mounting as compared with the case where the semiconductor chip is mounted onto the package substrate by wire bonding for example, with consequent increase of the package manufacturing cost.

Further, in case of using a ceramic material as the material of package, the material cost becomes higher than in case of using a plastic material for example, thus resulting in an increase of the package manufacturing cost.

In an effort to solve the above-mentioned problems the present inventors made a study about means for forming a package on which is mounted a semiconductor chip with high-speed LSI formed thereon by adopting a wire bonding method and a packaging method which uses a plastic material such as an epoxy resin as a packaging material. Through this study the present inventors found out the following problem.

The adoption of the wire bonding method results in an increase of impedance at bonding wire portions, so that the transmission characteristic from signal transmission lines to electrode pads on the semiconductor chip can no longer be maintained in a satisfactory condition.

It is an object of the present invention to provide means for forming a package on which is mounted a semiconductor chip with high-speed LSI formed thereon, by using the wire bonding method.

The above and other objects and novel features of the present invention will become apparent from the following description and the accompanying drawings.

The following is a brief description of typical modes of the present invention as disclosed herein.

A semiconductor chip used in a semiconductor device according to the present invention comprises a first wiring formed on a semiconductor substrate and connected electrically to a ground potential, a first insulating film formed on the first wiring, and a second wiring formed on the first insulating film and serving as a signal transmission line, the second wiring including a first region, a second region, and a third region, wherein bonding wires are connected to the first region of the second wiring, and the width of the second wiring in the second region is larger than the width thereof in the third region.

A method of manufacturing a semiconductor device according to the present invention comprises the steps of providing a lead frame, the lead frame having a die pad smaller than a main surface of a semiconductor chip and a plurality of leads each comprising an outer terminal portion and an inner lead portion, the inner lead portions of the plural leads being bent in a direction away from a surface on which the outer terminal portions of the plural leads are arranged, providing a semiconductor chip having a semiconductor element and a plurality of electrodes, protruding the semiconductor chip from the die pad and bonding a back side of the semiconductor chip and the die pad with each other, connecting the electrodes of the semiconductor chip and corresponding inner lead portions of the lead frame electrically with each other through bonding wires, sealing the semiconductor chip, the bonding wires and the plural inner lead portions with resin to form a sealing member in such a manner that the outer terminal portions of the leads are exposed to a mounting surface of the sealing member and that the inner lead portions of the leads are disposed inside the sealing member, and separating the plural leads from the lead frame.

DETAILED DESCRIPTION OF PREFERRED EMBODIMENTS

Figure 1:
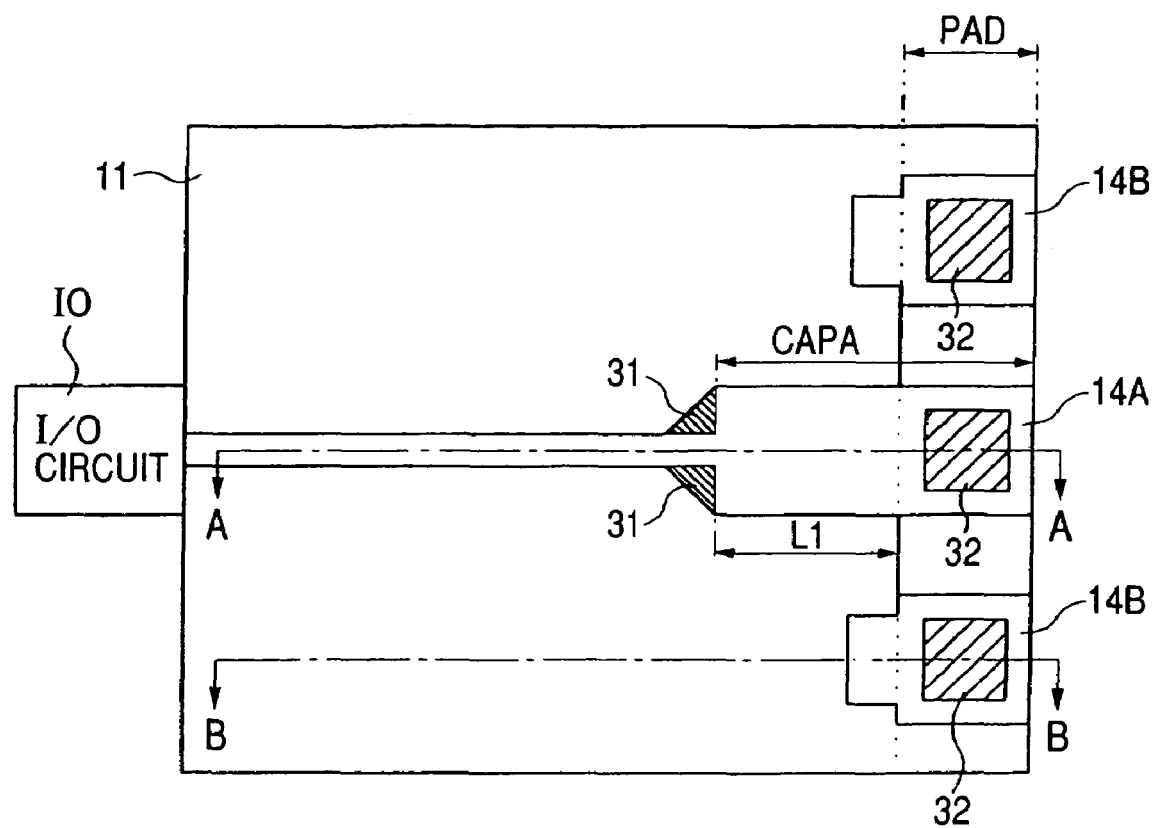
FIG. 1 is a plan view of a principal portion of a semiconductor device according to a first embodiment of the present invention.

Embodiments of the present invention will be described in detail hereinunder with reference to the accompanying drawings. In all of the drawings for illustration of the embodiments, components having the same functions are identified by like reference numerals, and repeated explanations thereof will be omitted. Further, in the drawings used for illustration of the following embodiments, even plan views may be hatched to facilitate understanding thereof.

First Embodiment

A semiconductor device of this first embodiment is a package on which is mounted a semiconductor chip with an IC (high-speed LSI) for optical communication for example formed thereon. FIG. 1 is a plan view of a principal portion of the semiconductor device of the first embodiment, FIG. 2 is a sectional view taken along line A-A in FIG. 2, FIG. 3 is a sectional view taken along line B-B in FIG. 1, and FIG. 4 is a sectional view of a principal portion of the semiconductor device of the first embodiment.

Figure 2:
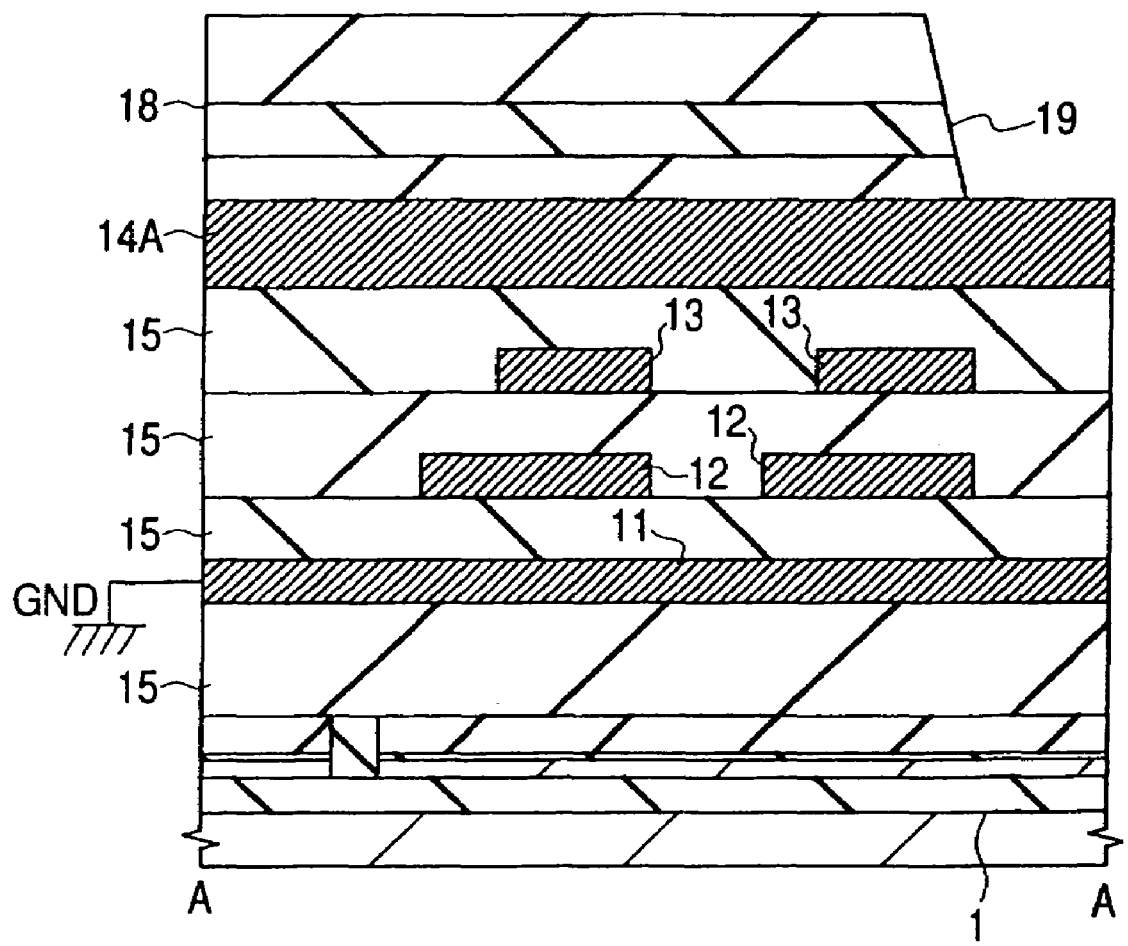
FIG. 2 is a sectional view taken along line A-A in FIG. 1.
Figure 3:
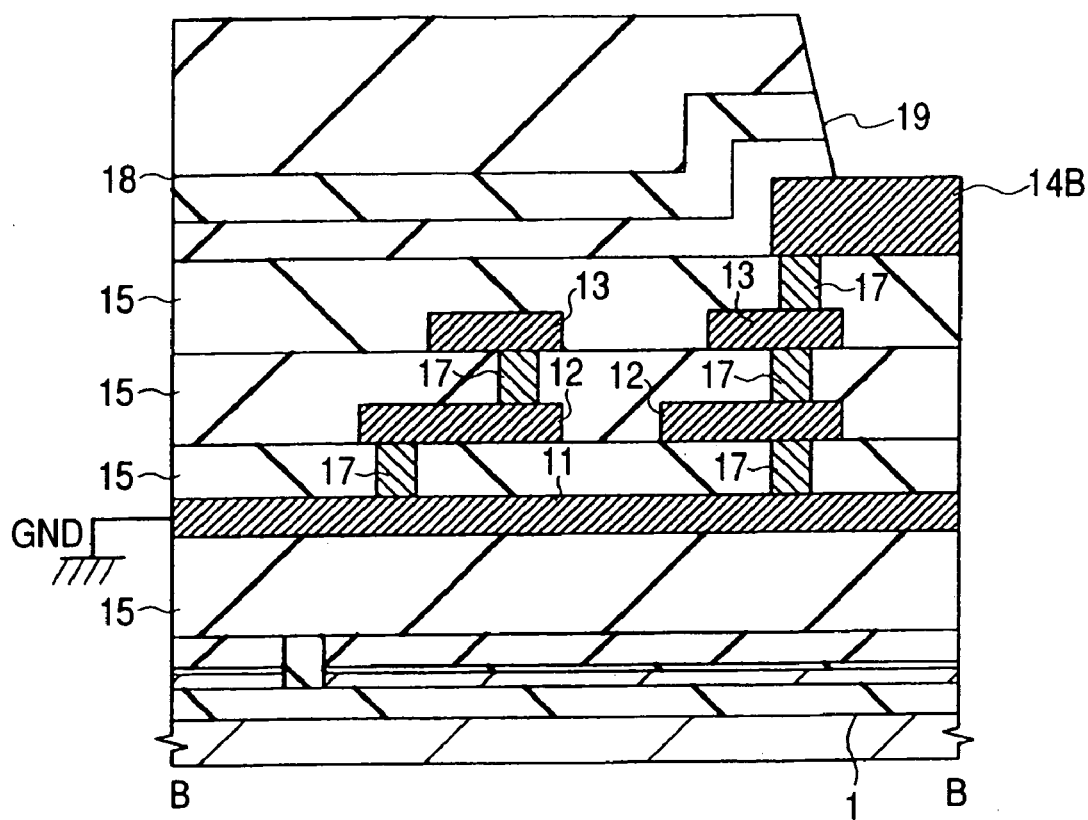
FIG. 3 is a sectional view taken along line B-B in FIG. 1.
Figure 4:
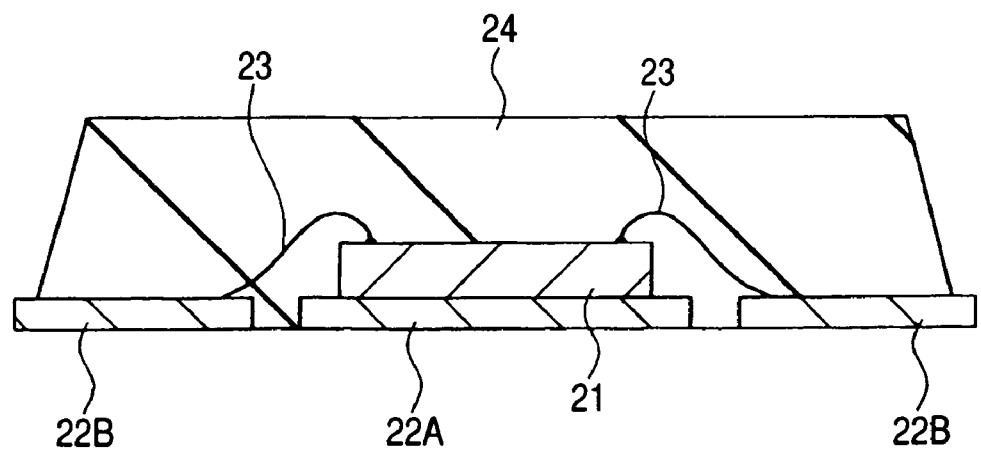
FIG. 4 is a sectional view of a principal portion of the semiconductor device of the first embodiment.

As shown in FIGS. 2 and 3, the semiconductor device of this first embodiment is formed by using a semiconductor substrate 1. The semiconductor substrate 1 is formed by bonding a single crystal silicon [SOI (Silicon On Insulator) layer] as a bonding substrate with a semiconductor element formed thereon and a single crystal silicon as a base substrate with each other through oxide film [BOX (Buried Oxide) layer] and subsequently thinning the bonding substrate. In FIGS. 2 and 3, in a region where an I/O (Input/Output) circuit (first circuit) IO (not shown) (see FIG. 1) is formed, at least one of an npn-type bipolar transistor and a pnp-type bipolar transistor is formed in the SOI layer of the semiconductor substrate 1.

On the semiconductor substrate 1 are formed, successively from below to above, a wiring layer (first wiring layer) including a first-layer wiring (first wiring) 11, a wiring layer including a second-layer wiring 12, a wiring layer including a third-layer wiring 13, and a wiring layer (second wiring layer) including fourth-layer wirings 14A and 14B. For example, these wirings can be formed by patterning a laminate film, the laminate film comprising a barrier conductor film which is a laminate film of Ti (titanium) film, TiN (titanium nitride) film and Ti film, an Al (aluminum) alloy film which serves as a main conductive layer, and a barrier conductor film which is a laminate film of Ti film and TiN film. The Al alloy film as a main conductive layer in the fourth-layer wirings 14A and 14B which are top-layer wirings are formed relatively thicker than the Al alloy films as main conductive layers in the other wirings. Interlayer insulating films (first insulating films) 15 formed of silicon oxide for example are formed between the first-layer wiring 11 and the semiconductor substrate 1 and also between wirings. Adjacent wirings except the fourth-layer wiring 14A are electrically connected with each other through a plug 17. For example, the plug 17 can be formed by depositing a Ti—TiN laminate film and W film successively into a hole formed in an interlayer insulating film 15 and thereafter removing the laminate film and W film present outside the hole.

The fourth-layer wiring (second wiring) 14A is a signal transmission line and is electrically connected to an I/O circuit 19. The fourth-layer wiring 14A and the first-layer wiring 11 sandwich a dielectric (interlayer insulating film 15) therebetween to form a so-called microstrip line (structure). The fourth-layer wiring 14B is connected electrically to a ground (reference) potential (GND) through the third-, second- and first-layer wirings 13, 12, 11. An end region (pad region) PAD (see FIG. 1) of the fourth-layer wirings 14A and 14B serves as a bonding pad for wire bonding. A protective film 18, which is a laminate of silicon oxide film, silicon nitride film and polyimide film successively from below, overlies the fourth-layer wirings 14A and 14B, and an aperture 19 is formed in the protective film 18 at a position above the bonding pad.

As shown in FIG. 4, a semiconductor chip 21 with an IC for optical communication formed thereon according to this first embodiment is bonded to a die pad 22A of a lead frame. The end region PAD (see FIG. 1) of the fourth-layer wirings 14A and 14B and outer leads 22B are wire bonded to each other through wires 23 made of Au (gold) and are sealed with an epoxy resin 24, thus are packaged. As a packaging material, by using such a plastic material as epoxy resin 24, it is possible to reduce the package fabricating cost relatively in comparison with the use of a ceramic material as a packaging material.

A line impedance Z in the package of this first embodiment can be expressed simply as $Z=(L/C)^{1/2}$ if inductance and capacitance are assumed to be L and C, respectively. For characteristic impedance matching of the signal transmission lines in the package, the line impedance Z is set to a predetermined value (first value), e.g., 50 Ω. In this first embodiment, as noted above, there is adopted means of wire-bonding the semiconductor chip 21 and the lead frame with each other. Consequently, an inductance component in the wires 23 is added and causes a change of the line impedance Z. For avoiding this inconvenience, as to the fourth-layer wiring 14A in this first embodiment, a region (first region) CAPA from an end portion including the region PAD is formed larger in wiring width than the region (third region) extending toward the I/O circuit IO. In this embodiment, by the wiring width is meant the size of wiring in a direction orthogonal to the extending direction of wiring. The region CAPA in the fourth-layer wiring 14A and the first-layer wiring 11 are used as capacitance electrodes, and three layers of interlayer insulating films 15 located between the first-layer wiring 11 and the fourth-layer wiring 14A are used as capacitance insulating films, to constitute a capacitor. In the fourth-layer wiring 14A, if the wiring width of the region CAPA from an end portion including the region PAD is set equal to the bonding pad portion, it becomes possible to facilitate the design of a capacitor having a predetermined capacitance value. By forming such a capacitor, the inductance component in the wires 23 can be offset by the capacitance component in the capacitor. As a result, when the semiconductor chip 21 and the outer leads 22B are connected together electrically by a wire bonding method using the wires 23, it is possible to prevent a change of the line impedance Z and attain characteristic impedance matching of the signal transmission lines in the package. As the transmission speed (frequency) of a signal traveling through the fourth-layer wiring 14A increases, there is a fear of signal reflection. However, since it is possible to attain characteristic impedance matching of the signal transmission lines in the package, the reflection of signal can be prevented even in the case where the frequency of the signal traveling through the fourth-layer wiring 14A is high (e.g., 1 GHz or higher).

Moreover, in case of forming a capacitor of a predetermined capacitance value with use of the first- and fourth-layer wirings 11, 14A, if the thickness of each of the interlayer insulating films 15 formed between the first-layer wiring 11 and the fourth-layer wiring 14A is small, it is necessary that the wiring width and the area of the fourth-layer wiring 14A in the region CAPA be made small accordingly. In this case, as the wiring width is made small, there is a fear that the machining accuracy of the fourth-layer wiring 14A may be deteriorated and there also is a fear that a resistance component in the fourth-layer wiring 14A may increase, causing deterioration in quality of the signal which travels through the fourth-layer wiring 14A as a signal transmission line. In this first embodiment, however, such an inconvenience can be avoided because three layers of interlayer insulating films 15 are formed between the first-layer wiring 11 and the fourth-layer wiring 14A.

The fourth-layer wiring 14A is formed in such a manner that the region CAPA and the other region are planarly contiguous to each other through forwardly tapered regions (second regions) 31. If capacitance adjustment is made with only the region CAPA without forming the regions 31, there may occur a lowering of the line impedance Z. But the formation of the regions 31 can prevent the occurrence of such an inconvenience.

As noted earlier, the region PAD in the fourth-layer wirings 14A and 14B serving as a bonding pad is disposed at end portions of the fourth-layer wirings 14A and 14B. As to the fourth-layer wiring 14A, the length of wire 23 can be shortened by making patterning so that the end portion of the fourth-layer wiring 14A reaches a position near an outer periphery portion of the semiconductor chip 21. That the length of wire 23 can be shortened means that the inductance component of the wire 23 can be diminished, whereby it also becomes possible to set small the capacitance value of the foregoing capacitor. As a result, even in case of transmitting a high-frequency signal to the fourth-layer wiring 14A, the transmission can be done without any loss.

Figure 5:
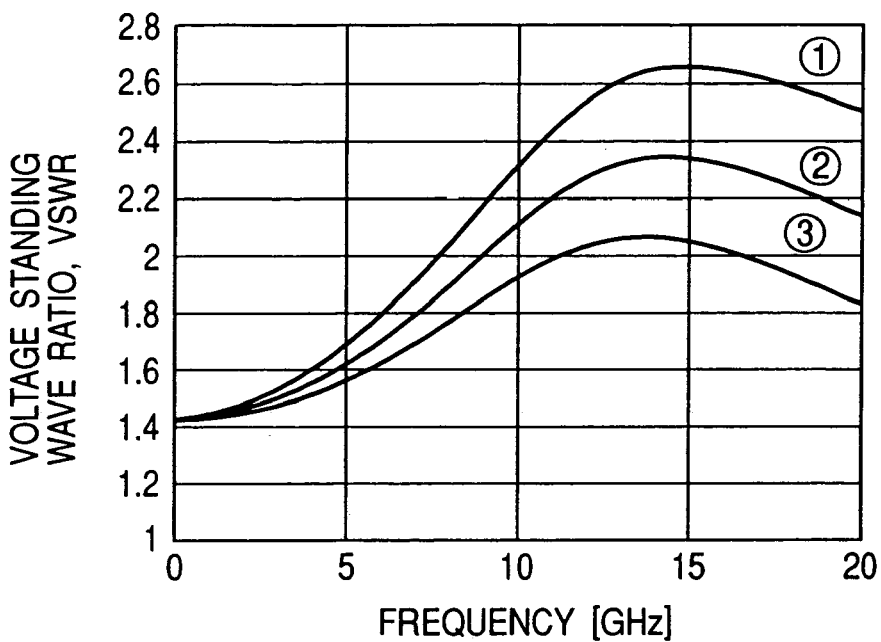
FIG. 5 is an explanatory diagram showing a dependence of a signal reflection characteristic of a signal transmission line on capacitance in the semiconductor device of the first embodiment.

The present inventors have checked a capacitance dependence of a signal reflection characteristic of the fourth-layer wiring 14A while setting the inductance of wire 23 to 1 nH and the distance L1 (see FIG. 1) between the region PAD and the region 31 in the fourth-layer wiring 14A to three values of 0, 50, and 100 μm. As shown in FIG. 5, as the distance L1 increases, a voltage standing wave ratio (VSWR) relative to the frequency of a signal traveling through the fourth-layer wiring 14A becomes smaller. That the voltage standing wave ratio becomes smaller means that the capacitance value of the capacitor formed by using the first-layer wiring 11 (see FIGS. 1 to 3), the fourth-layer wiring 14A and the interlayer insulating films 15 (see FIGS. 1 to 3) becomes larger and the transmission signal loss increases. As noted previously, the semiconductor device of this first embodiment is an IC for optical communication and the frequency of the signal traveling through the fourth-layer wiring 14A is about 12 GHz or less. If a signal of such a frequency band travels through the fourth-layer wiring 14A having the distance L1 of 100 µm, the transmission signal loss becomes large and thus it follows that designing the distance L1 to 100 µm is not appropriate. On the other hand, that the voltage standing wave ratio becomes larger means that the reflection of the signal traveling through the fourth-layer wiring 14A becomes larger. Besides, as mentioned earlier, with an increase in transmission speed (frequency) of the signal traveling through the fourth-layer wiring 14A, the reflection of the transmission signal becomes larger. Since the semiconductor device of this first embodiment is an IC for optical communication, a signal of a high frequency (e.g., 1 GHz or higher) travels through the fourth-layer wiring 14A. Therefore, as shown in FIG. 5, if the distance L1 is 0 µm, the reflection of the signal traveling through the fourth-layer wiring 14A becomes large and thus it follows that designing the distance L1 to 0 µm is inappropriate. In view of this point, if the distance L1 is designed to be 50 µm intermediate between 0 and 100 µm, it becomes possible to prevent both loss and reflection of the transmission signal in the fourth-layer wiring 14A. In the experiment conducted by the present inventors, by setting the distance L1 at 50 µm, it became possible to prevent both loss and reflection of the transmission signal in the fourth-layer wiring 14A. But it goes without saying that the distance L1 can be changed in accordance with design values of other members than the fourth-layer wiring 14A.

According to this first embodiment, as described above, when the semiconductor chip 21 and the outer leads 22B are connected together electrically by a wire bonding method using wires 23, it is possible to attain characteristic impedance matching of the signal transmission lines in the package. As a result, in the IC for optical communication according to this first embodiment it is possible to improve the signal transmission speed. Moreover, since it is possible to prevent both loss and reflection of the transmission signal in the fourth-layer wiring 14A, it is possible to prevent distortion in waveform of the transmission signal. Consequently, it is possible to improve the signal receiving sensitivity of the semiconductor device of this first embodiment.

Second Embodiment

Figure 6:
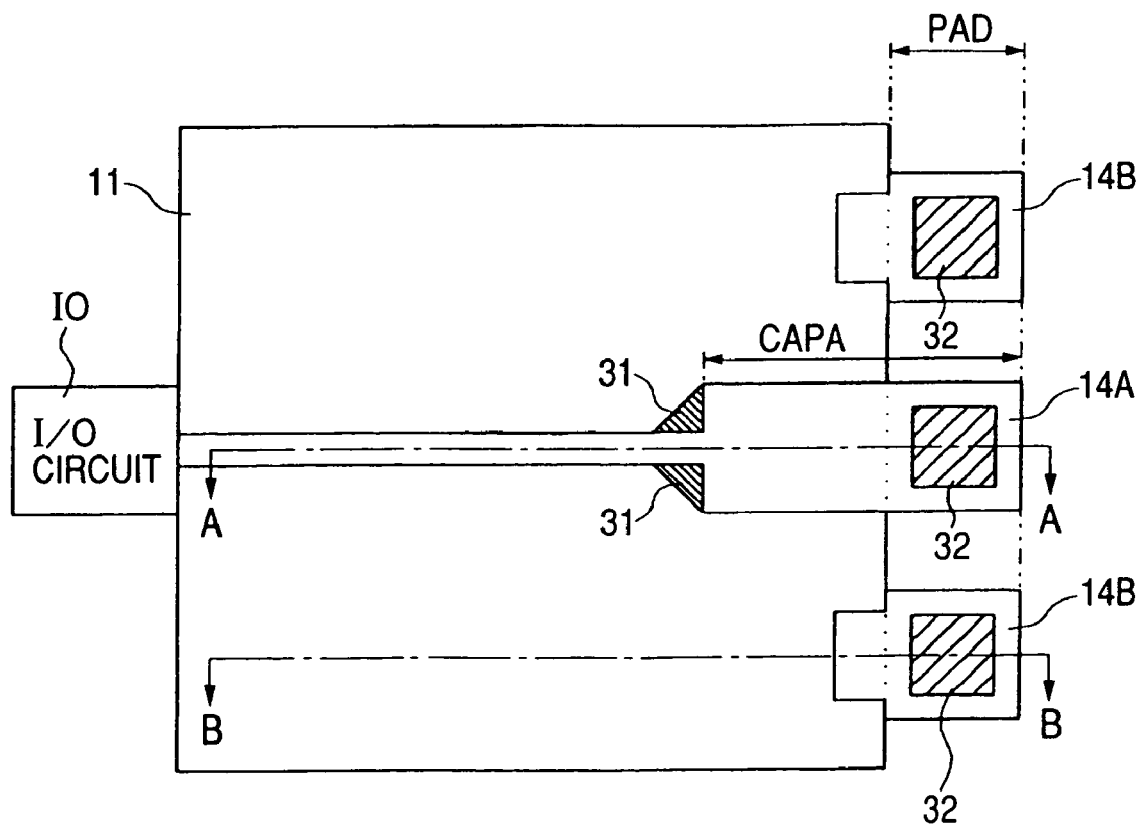
FIG. 6 is a plan view of a principal portion of a semiconductor device according to a second embodiment of the present invention.
Figure 7:
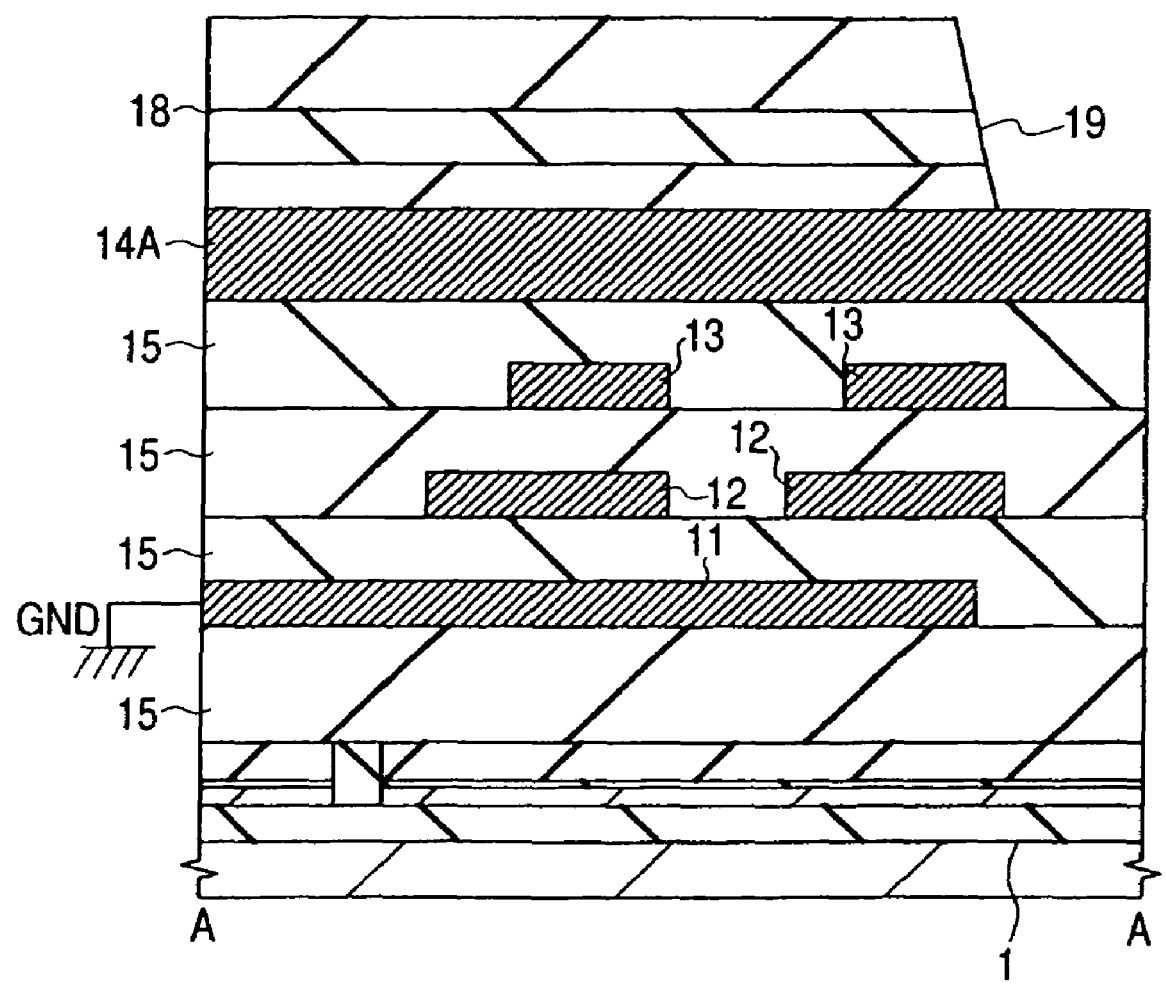
FIG. 7 is a sectional view taken along line A-A in FIG. 6.
Figure 8:
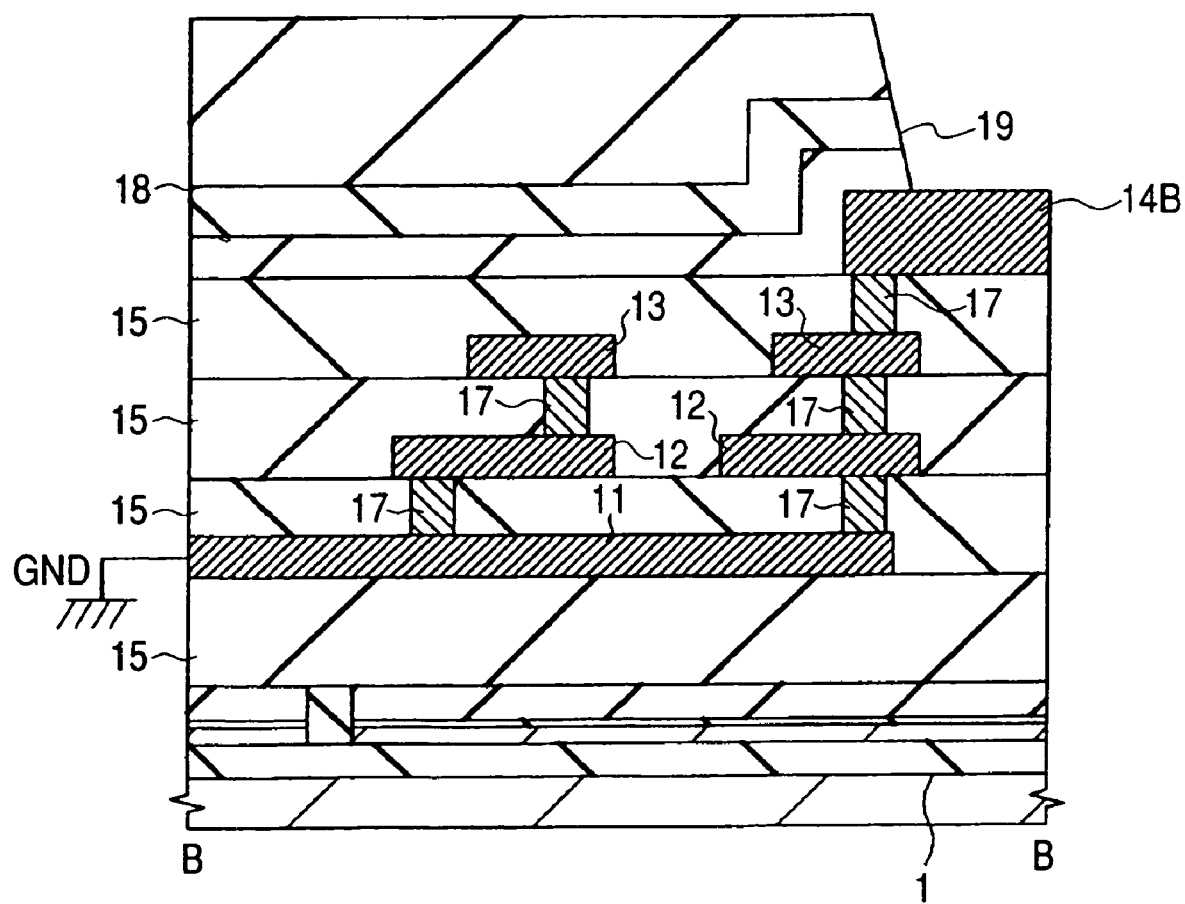
FIG. 8 is a sectional view taken along line B-B in FIG. 6.

A semiconductor device according to a second embodiment of the present invention will be described below. FIG. 6 is a plan view of a principal portion of the semiconductor device of the second embodiment, FIG. 7 is a sectional view taken along line A-A in FIG. 6, and FIG. 8 is a sectional view taken along line B-B in FIG. 6.

The semiconductor device of this second embodiment has a first-layer wiring 11 (see FIGS. 1 to 3) whose plane shape is modified from that in the semiconductor device of the first embodiment. More specifically, as shown in FIGS. 6 to 8, a first-layer wiring 11 is formed by patterning so as not to be positioned under the end region PAD of the fourth-layer wirings 14A and 14B serving as a bonding pad. As a result, in the region PAD, an interlayer insulating film 15 relatively lower in mechanical strength than the fourth-layer wirings 14A, 14B and the first-layer wiring 11 is not present between the fourth-layer wirings 14A, 14B and the first-layer wiring 11, whereby it is possible to cushion the impact at the time of bonding wires 23 (see FIG. 4) to the bonding pad. Consequently, it is possible to prevent cracking of the interlayer insulating film 15.

Also by the semiconductor device of this second embodiment described above there can be obtained the same effects as in the previous first embodiment.

Third Embodiment

Figure 9:
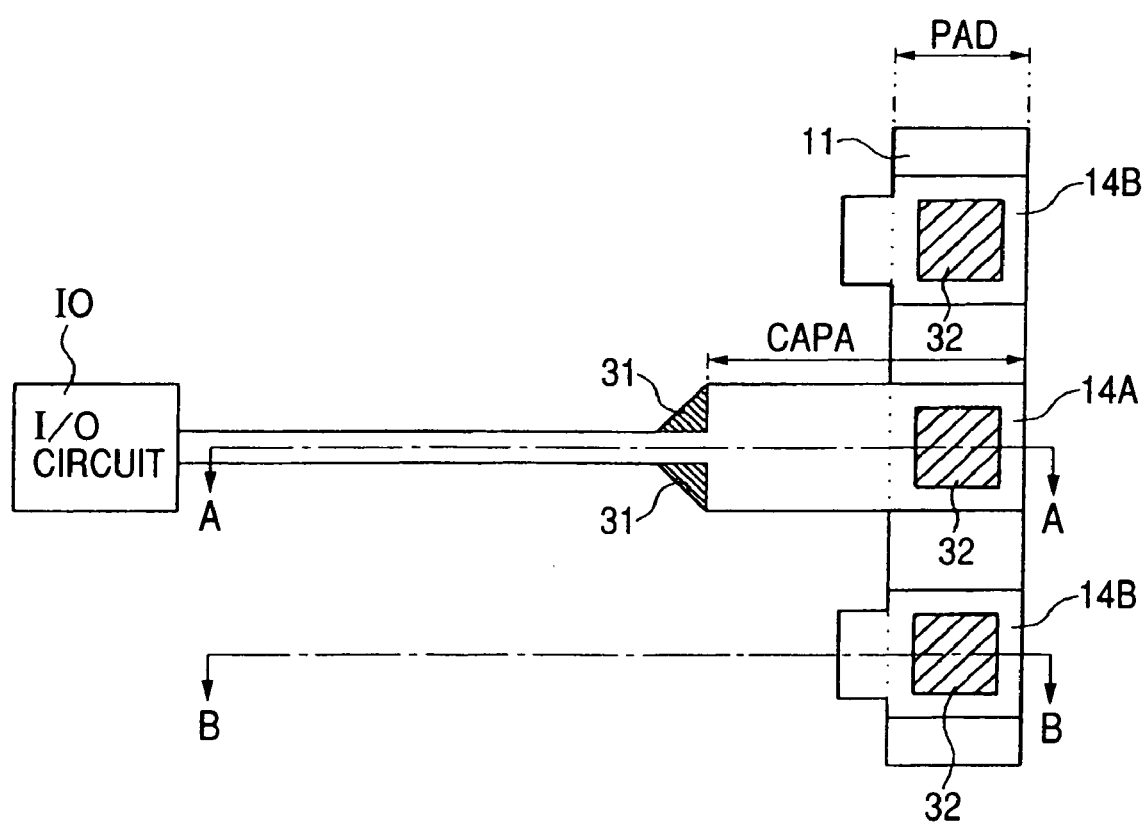
FIG. 9 is a plan view of a principal portion of a semiconductor device according to a third embodiment of the present invention.
Figure 10:
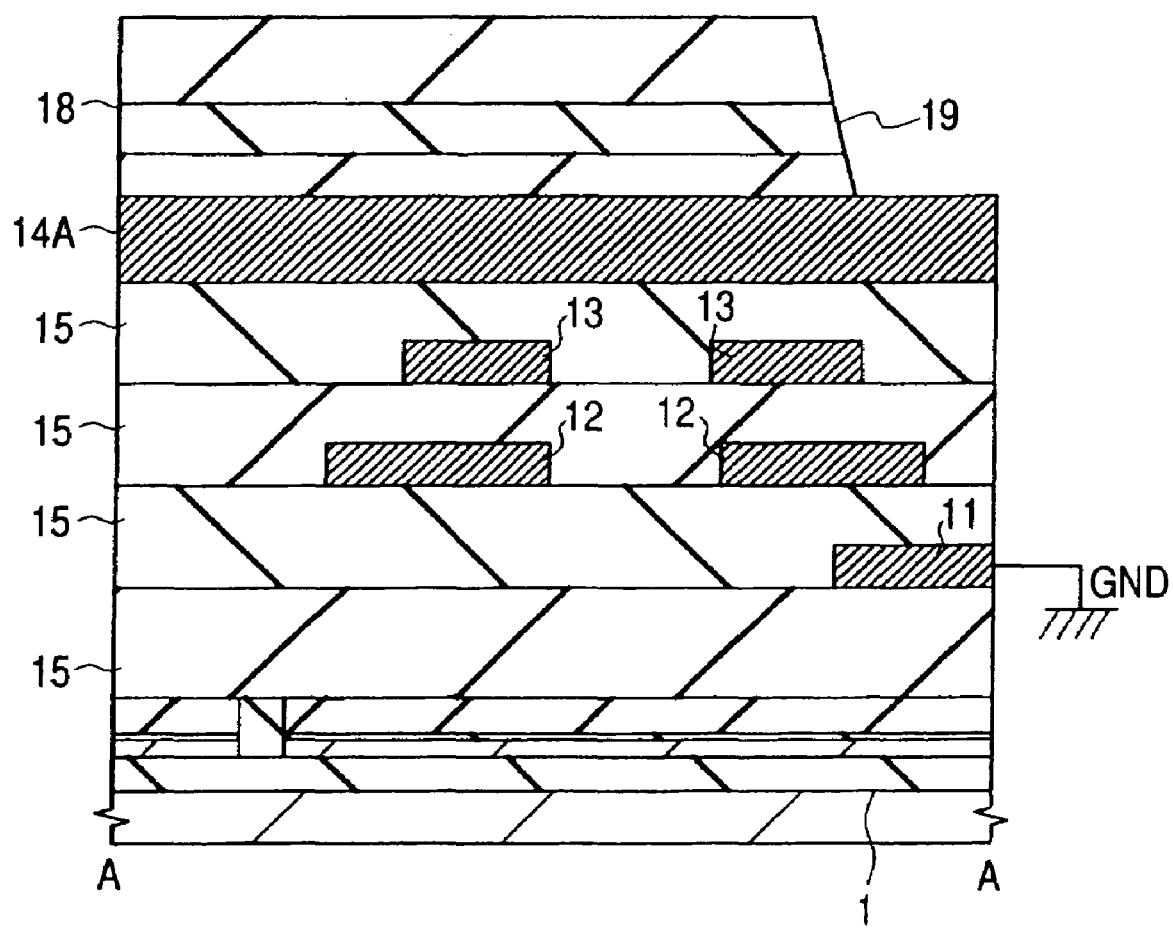
FIG. 10 is a sectional view taken along line A-A in FIG. 9.
Figure 11:
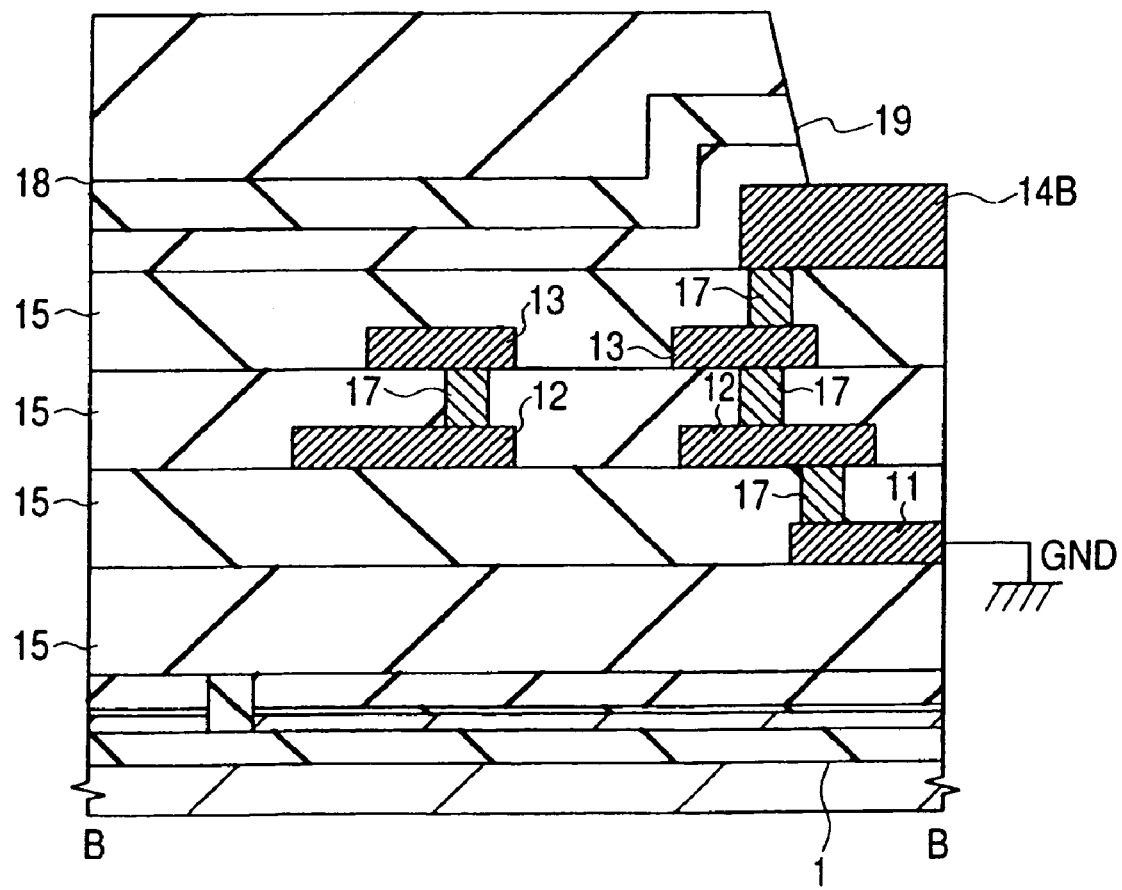
FIG. 11 is a sectional view taken along line B-B in FIG. 9.

A description will be given below about a semiconductor device according to a third embodiment of the present invention. FIG. 9 is a plan view of a principal portion of the semiconductor device of the third embodiment, FIG. 10 is a sectional view taken along line A-A in FIG. 9, and FIG. 11 is a sectional view taken along line B-B in FIG. 9.

In the semiconductor device of this third embodiment, a planar shape of the first-layer wiring 11 (see FIGS. 1 to 3) in the semiconductor of the first embodiment is modified. More specifically, patterning is made so that a first-layer wiring 11 is disposed in the region PAD in plan, whereby a capacitance component is formed using first- and fourth-layer wirings 11, 14A of a smaller area than in the first embodiment in plan and it is possible to attain characteristic impedance matching of signal transmission lines in the package of this third embodiment.

Also by such a semiconductor device of this third embodiment it is possible to obtain the same effects as in the semiconductor device of the first embodiment.

Fourth Embodiment

Figure 12:
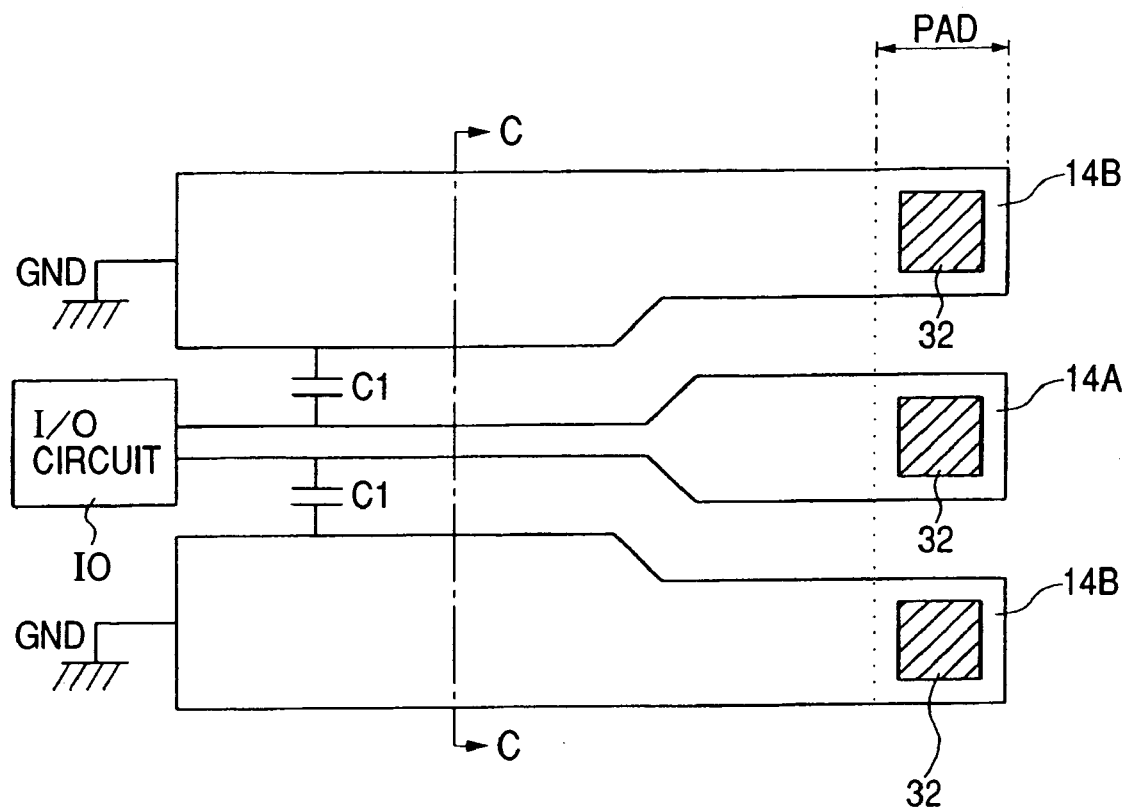
FIG. 12 is a plan view of a principal portion of a semiconductor device according to a fourth embodiment of the present invention.
Figure 13:
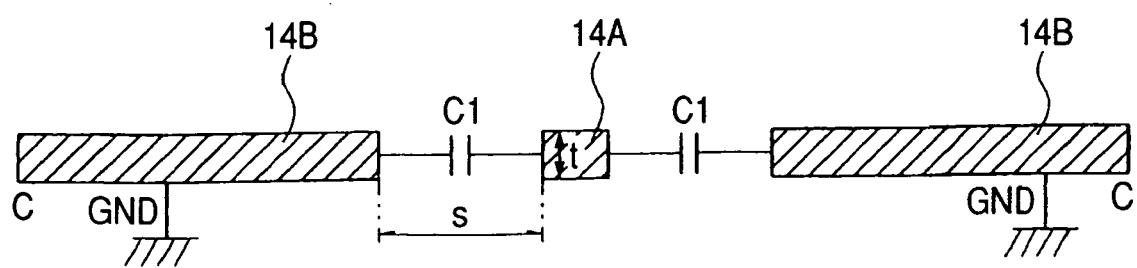
FIG. 13 is a sectional view taken along line C-C in FIG. 12.

A description will be given below about a semiconductor device according to a fourth embodiment of the present invention. FIG. 12 is a plan view of a principal portion of the semiconductor device of this fourth embodiment and FIG. 13 is a sectional view taken along line C-C in FIG. 12.

In the semiconductor device of this fourth embodiment, a planar shape of the fourth-layer wiring (third wiring) 14B (see FIGS. 1 to 3) in the semiconductor device of the first embodiment is modified. More specifically, as shown in FIGS. 12 and 13, fourth-layer wirings 14A and 14B used in the semiconductor device of this fourth embodiment have a coplanar structure wherein they are arranged at predetermined certain intervals, whereby a capacitance component C1 can be formed between adjacent fourth-layer wirings 14A and 14B. Also by forming such a capacitance component C1 it is possible to attain characteristic impedance matching of signal transmission lines in the package. The capacitance component C1 is determined on the basis of a thickness, t, of each of the fourth-layer wirings 14A and 14B and a spacing, s, between adjacent fourth-layer wirings 14A and 14B. Therefore, in comparison with the first embodiment wherein the capacitance value is controlled by controlling the thickness of each of the three layers of interlayer insulating films 15 (see FIGS. 2 and 3) larger than those values, it is possible to facilitate controlling the capacitance value of the capacitance component C1 in this fourth embodiment.

Also by the semiconductor device of this fourth embodiment described above there can be obtained the same effects as in the semiconductor device of the first embodiment.

Fifth Embodiment

Figure 14:
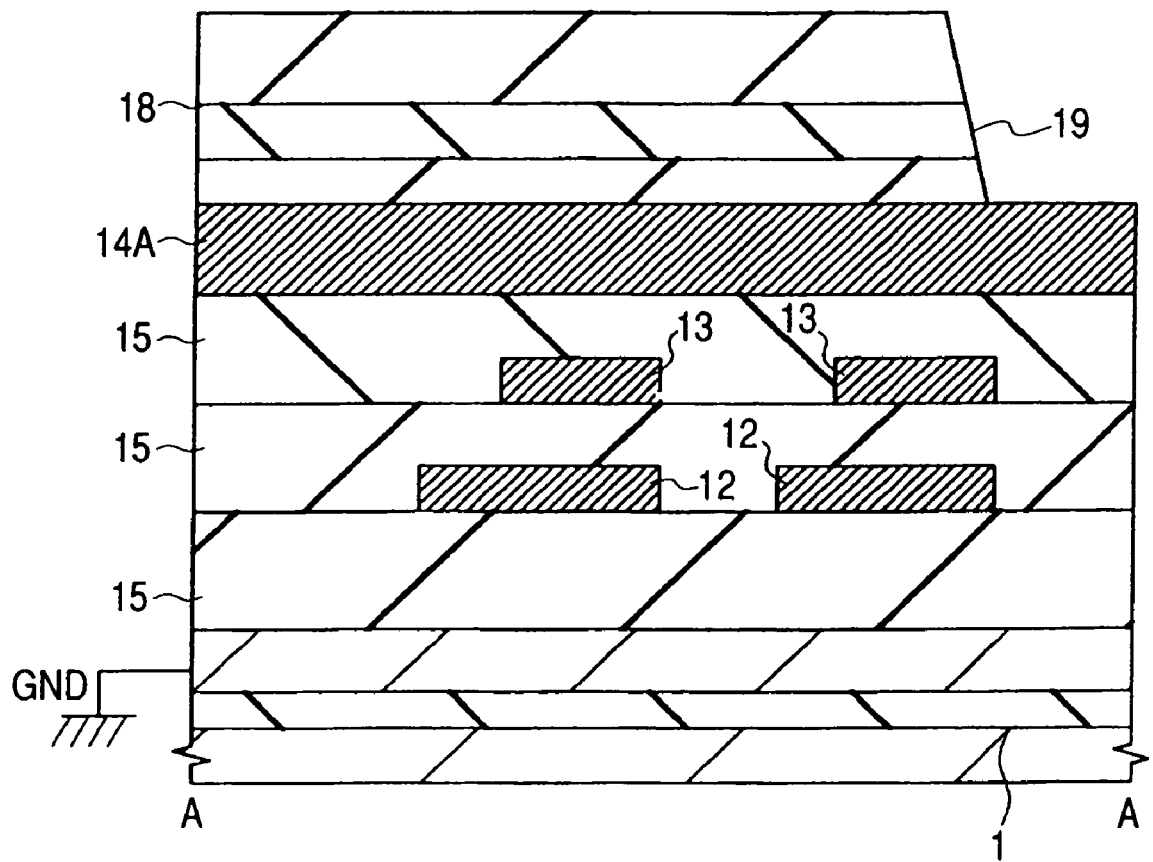
FIG. 14 is a sectional view of a principal portion of a semiconductor device according to a fifth embodiment of the present invention.
Figure 15:
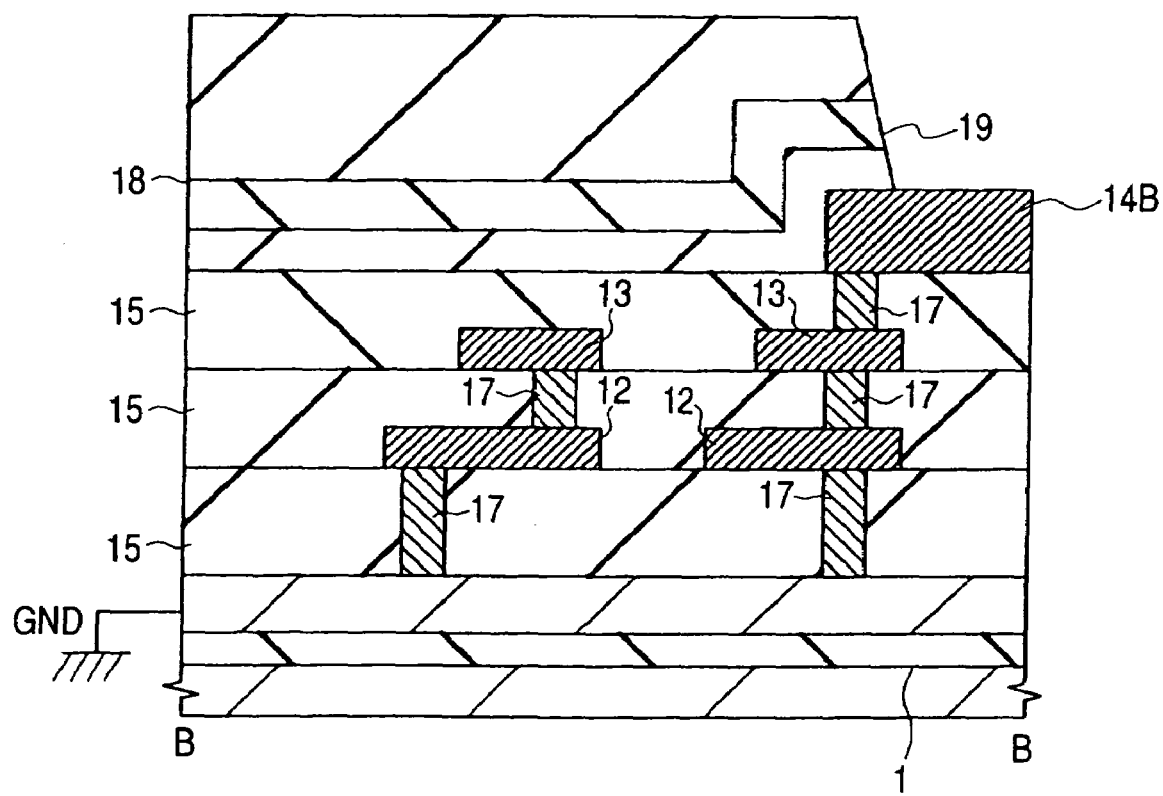
FIG. 15 is a sectional view of a principal portion of the semiconductor device of the fifth embodiment.

The following description is now provided about a semiconductor device according to a fifth embodiment of the present invention. FIGS. 14 and 15 are sectional views of a principal portion of the semiconductor device of this fifth embodiment.

In the semiconductor device of this fifth embodiment, the first-layer wiring 11 (see FIGS. 1 to 3) used in the first embodiment is omitted. More specifically, as shown in FIGS. 14 and 15, an SOI layer of a semiconductor substrate 1 is electrically connected to a ground (reference) potential (GND) and a second-layer wiring 12 connected electrically to a fourth-layer wiring 14B is connected electrically to the SOI layer through a plug 17. Consequently, in this fifth embodiment, a capacitance component equal to that formed between adjacent first-layer wiring 11 and fourth-layer wiring 14A in the first embodiment can be formed between the semiconductor substrate (SOI layer) and the fourth-layer wiring 14A. As a result, according to this fifth embodiment, the step of forming the first-layer wiring 11 can be omitted and hence it is possible to reduce the number of manufacturing steps for the semiconductor device of this fifth embodiment. That is, it is possible to shorten TAT (Turn Around Time) required for manufacturing the semiconductor device of this fifth embodiment.

Also by the semiconductor device of the fifth embodiment described above there can be obtained the same effects as in the first embodiment.

Sixth Embodiment

Figure 16:
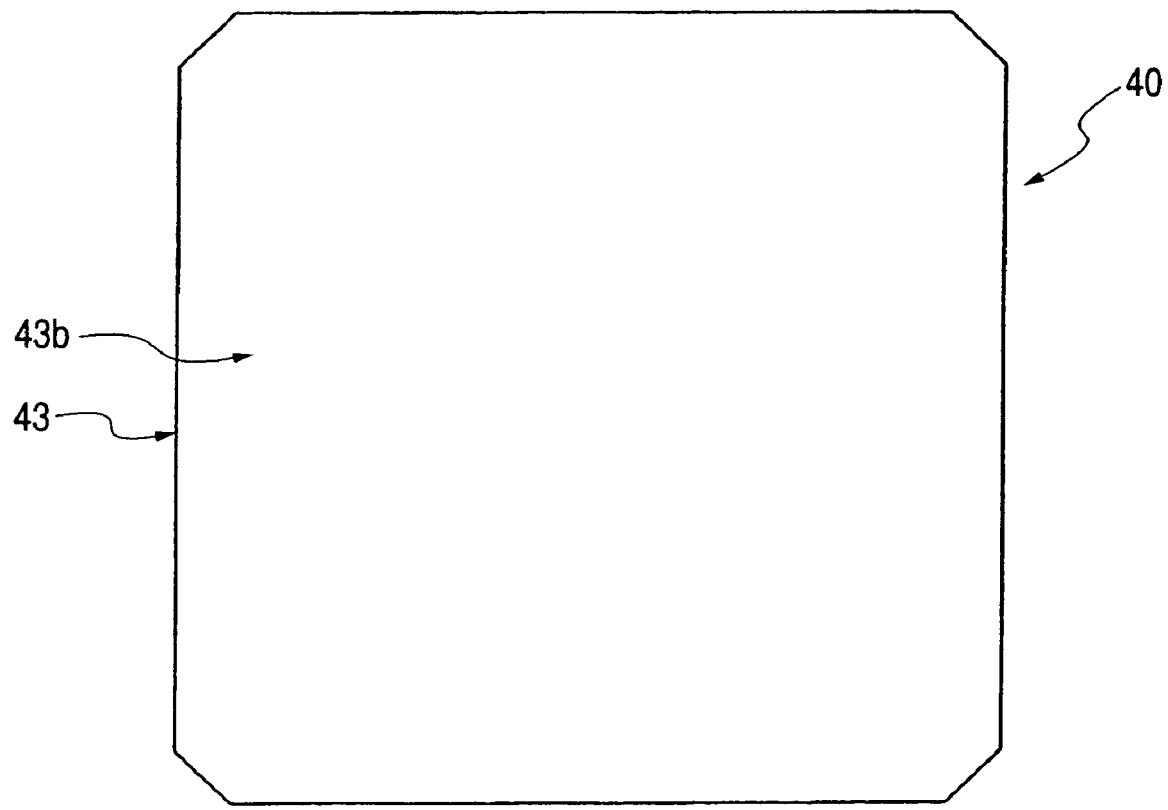
FIG. 16 is a plan view showing a structural example of a semiconductor device (QFN) according to a sixth embodiment of the present invention.
Figure 17:
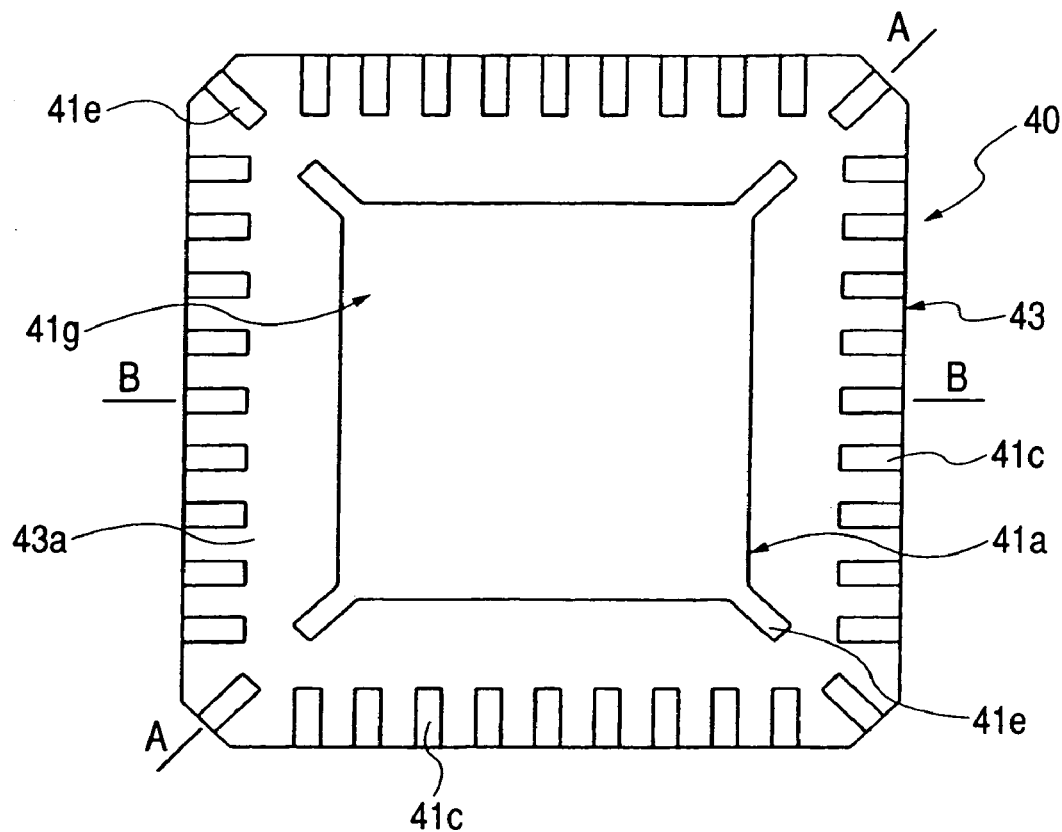
FIG. 17 is a bottom view showing a structure of the QFN illustrated in FIG. 16.
Figure 18:
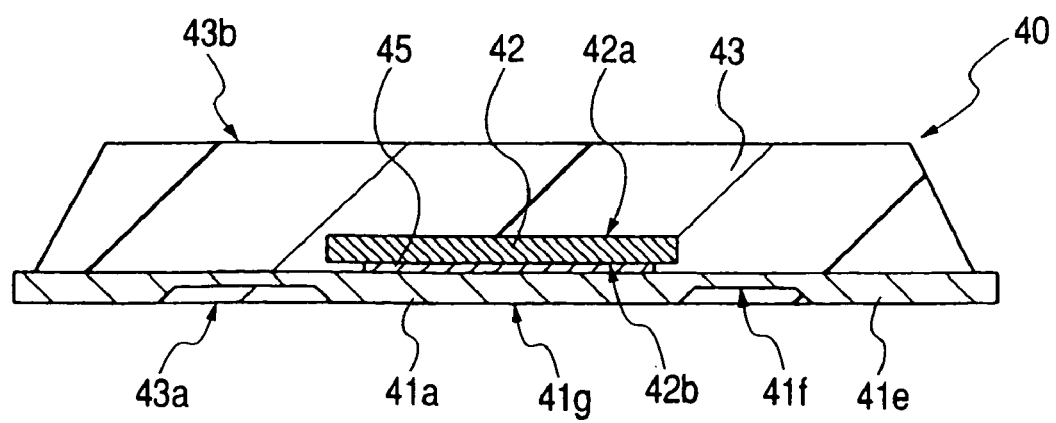
FIG. 18 is a sectional view showing a structure taken along line A-A in FIG. 17.
Figure 19:
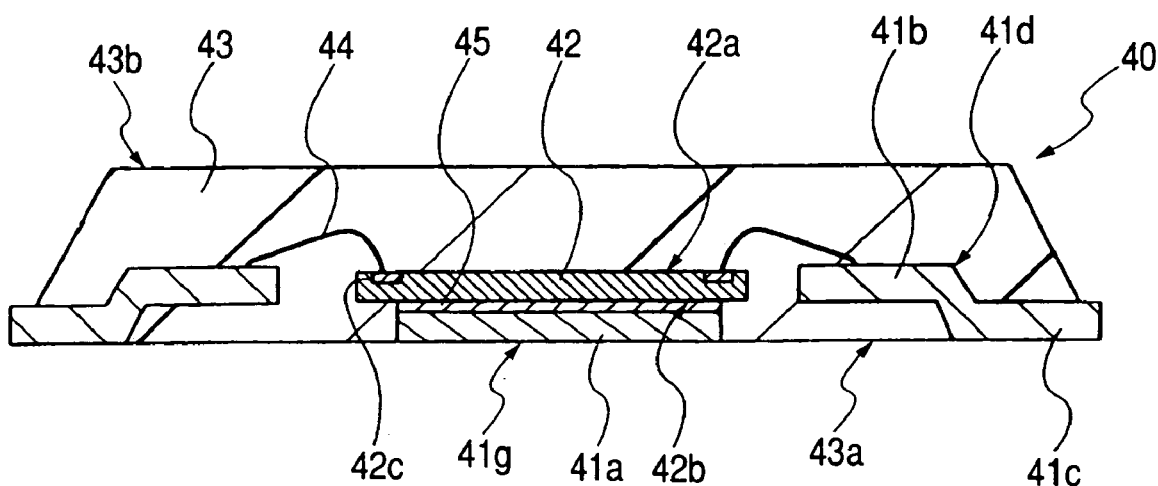
FIG. 19 is a sectional view showing a structure taken along line B-B in FIG. 17.
Figure 20:
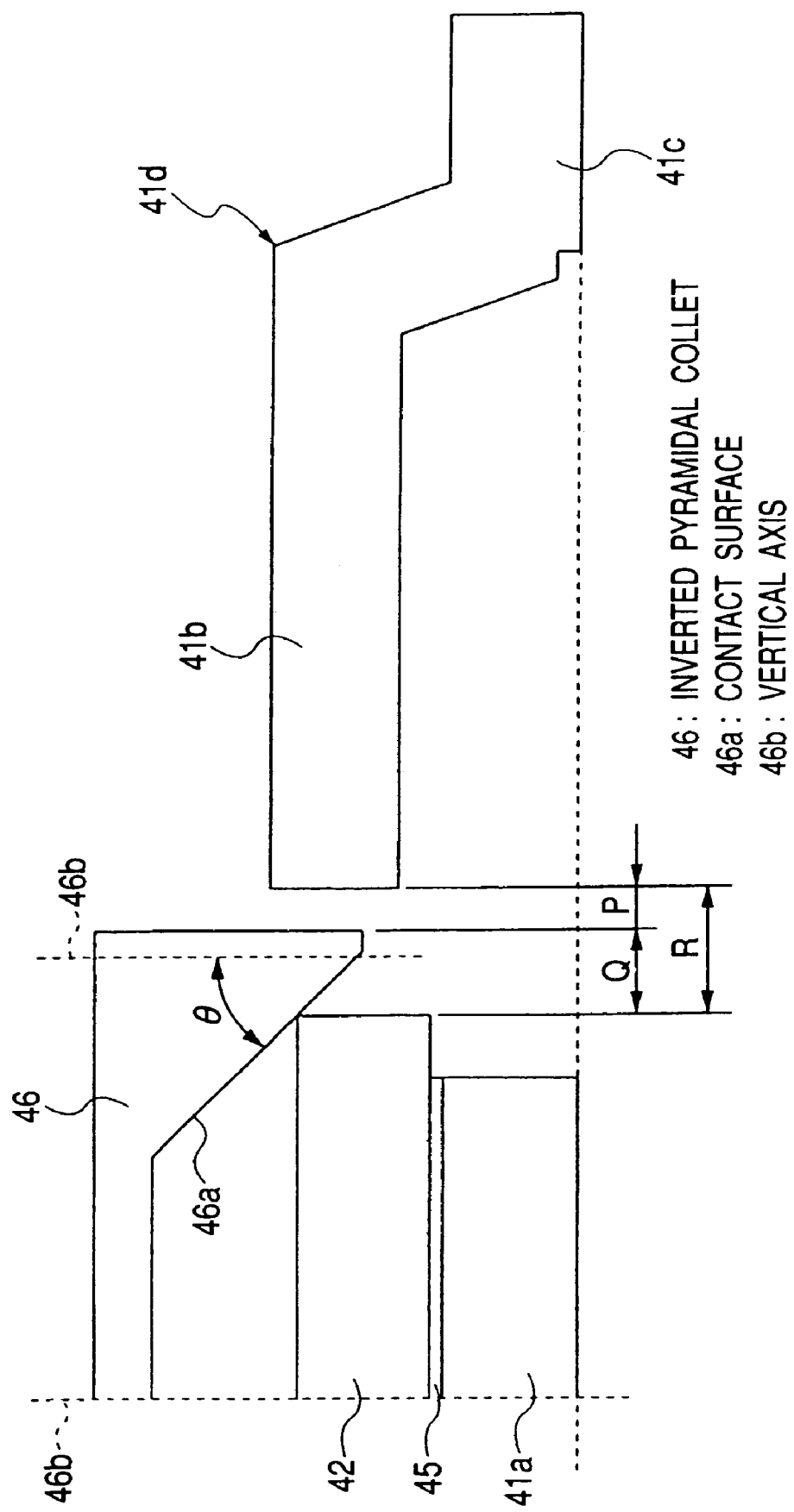
FIG. 20 is a construction diagram showing an example of a positional relation between an inverted pyramidal collet and an inner lead portion during die bonding in assembling the QFN shown in FIG. 16.
Figure 21:
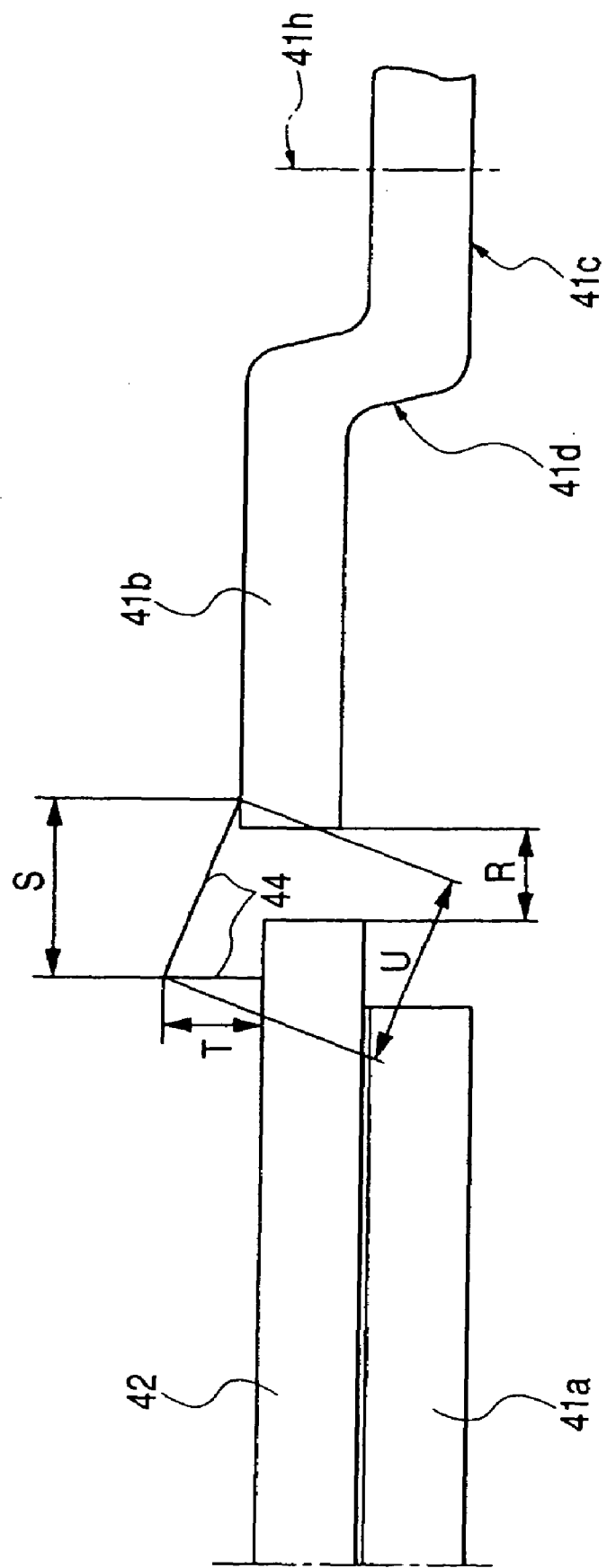
FIG. 21 is a construction diagram showing an example of a wire length simulation result in the QFN illustrated in FIG. 16.
Figure 22:
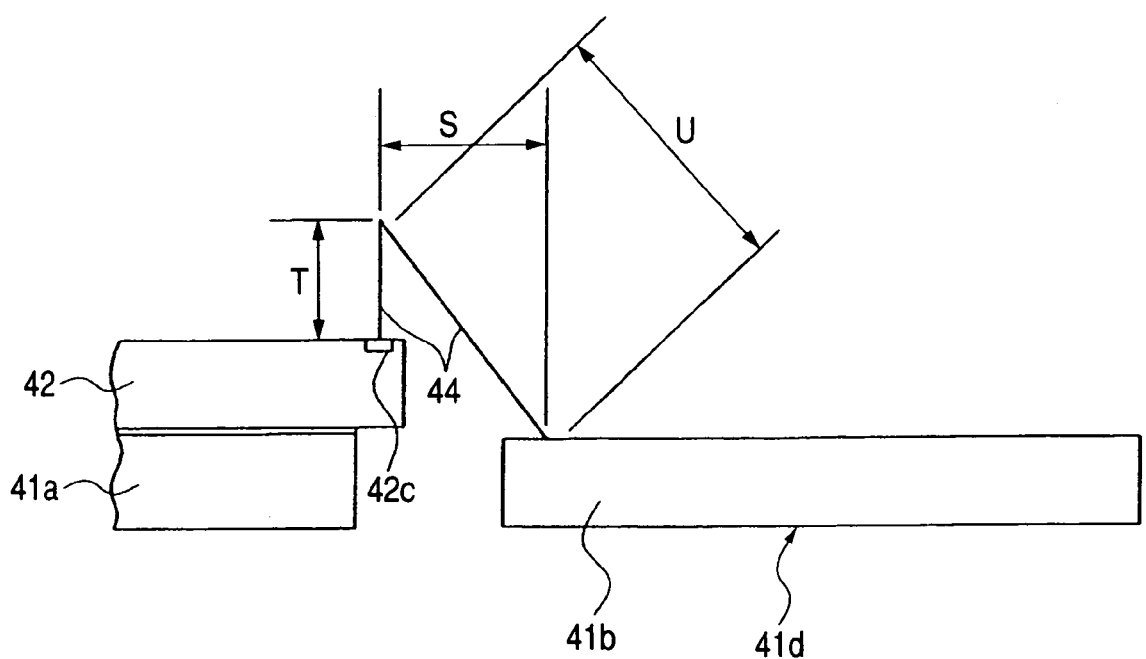
FIG. 22 is a construction diagram showing a wire length simulation result in a QFN as a comparative example.
Figure 23:
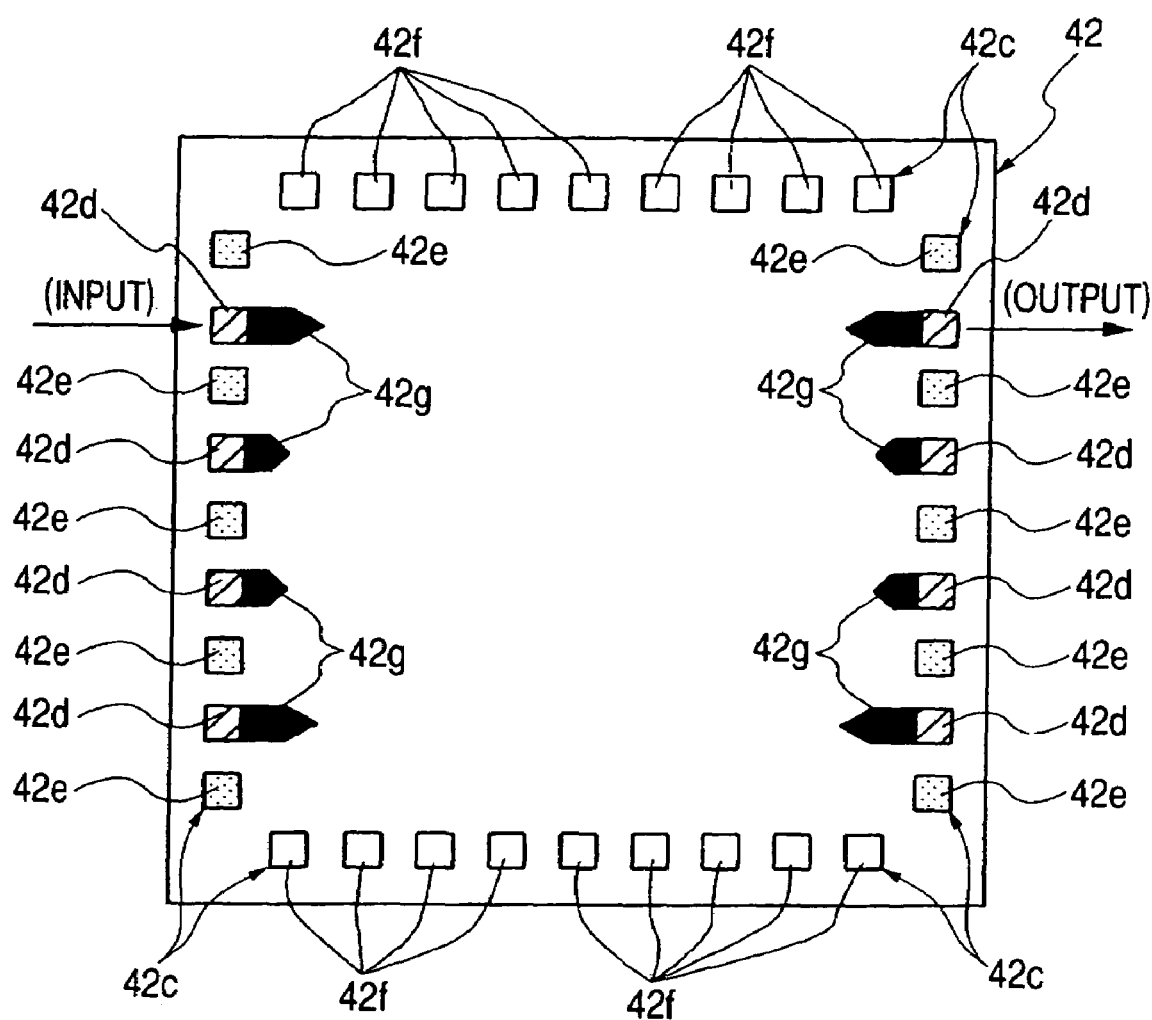
FIG. 23 is a plan view showing an example of pad array and the magnitude of an additional capacitance in a semiconductor chip incorporated in the QFN illustrated in FIG. 16.
Figure 24:
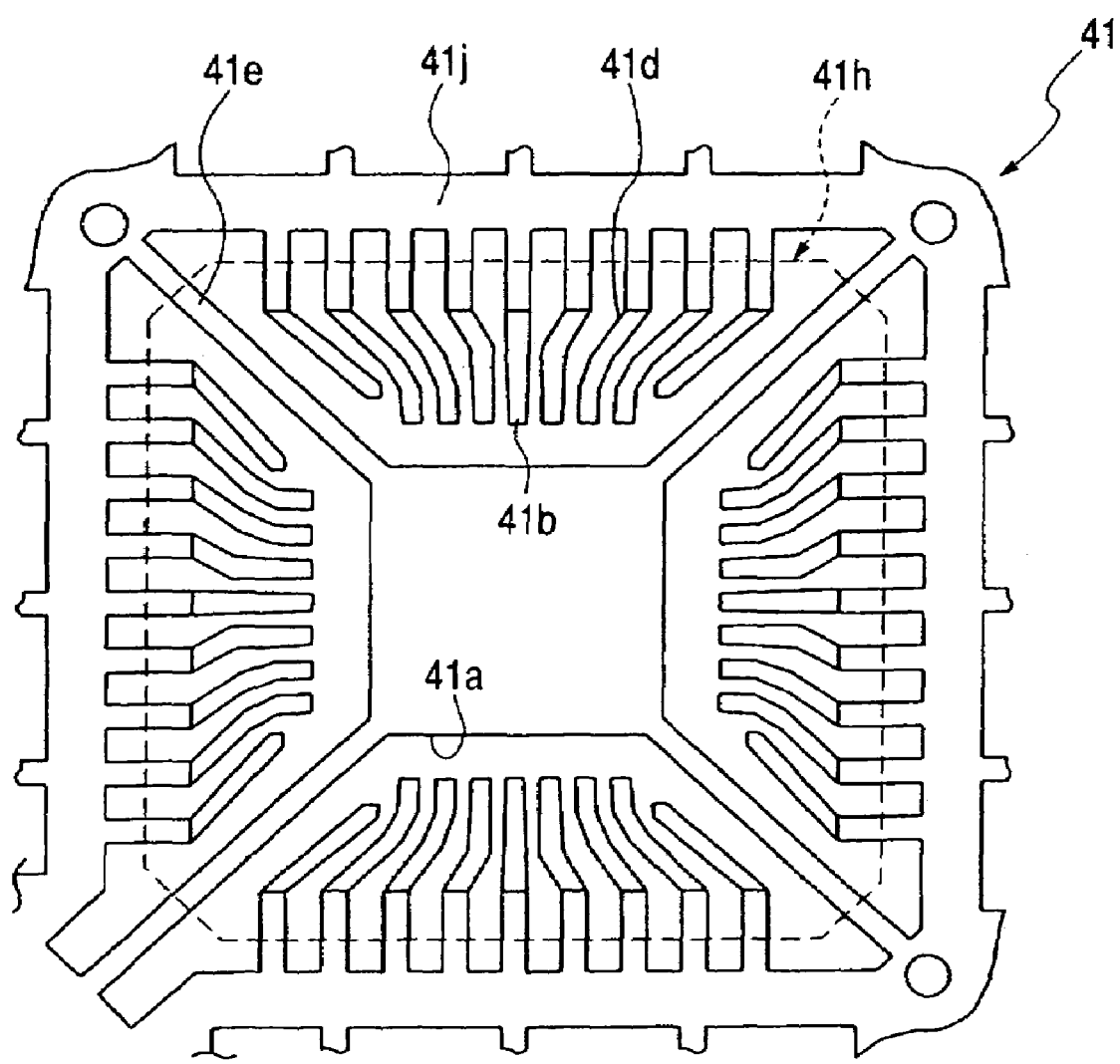
FIG. 24 is a partial plan view showing a structural example of a lead frame which is used in assembling the QFN illustrated in FIG. 16.
Figure 25:
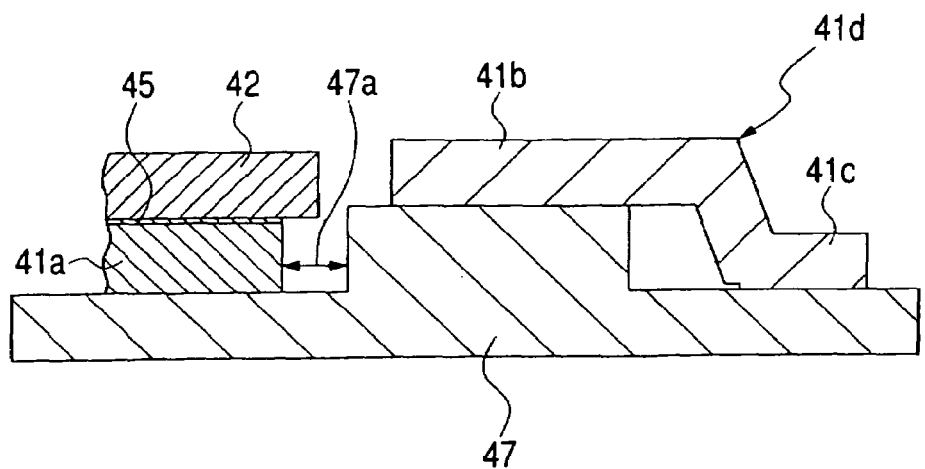
FIG. 25 is a partial sectional view showing an example of a heated state of a lead during wire bonding in assembling the QFN illustrated in FIG. 16.
Figure 26:
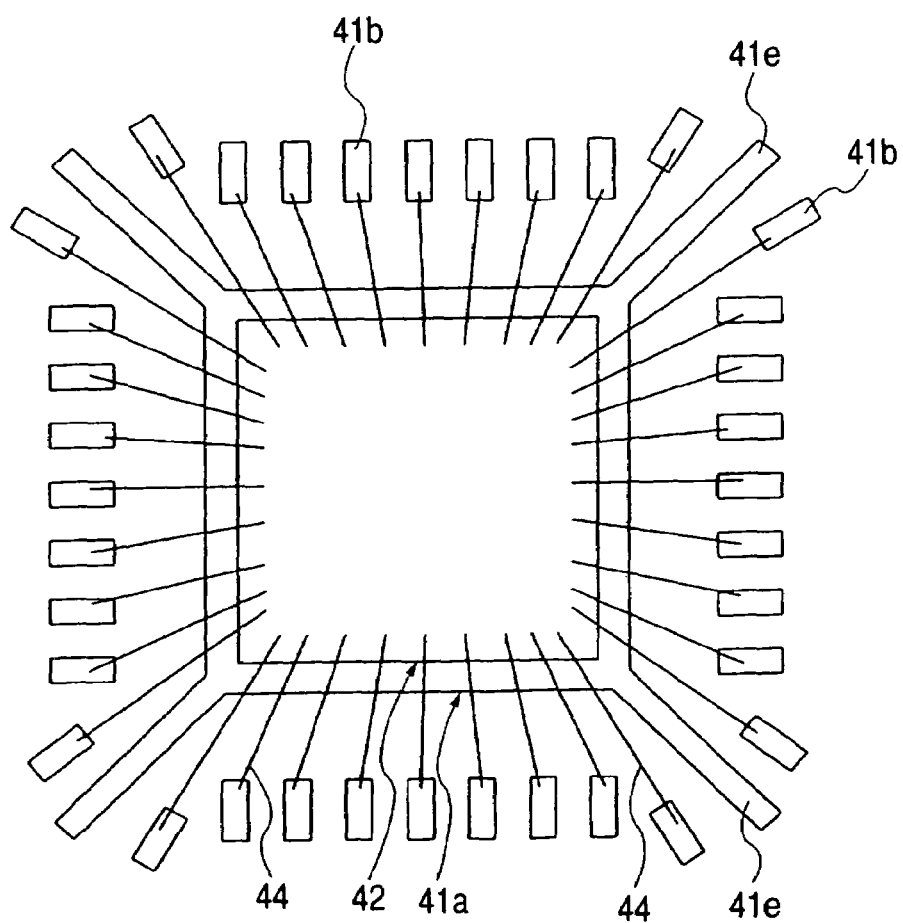
FIG. 26 is a partial plan view showing a structural example after wire bonding in assembling the QFN illustrated in FIG. 16.
Figure 27:
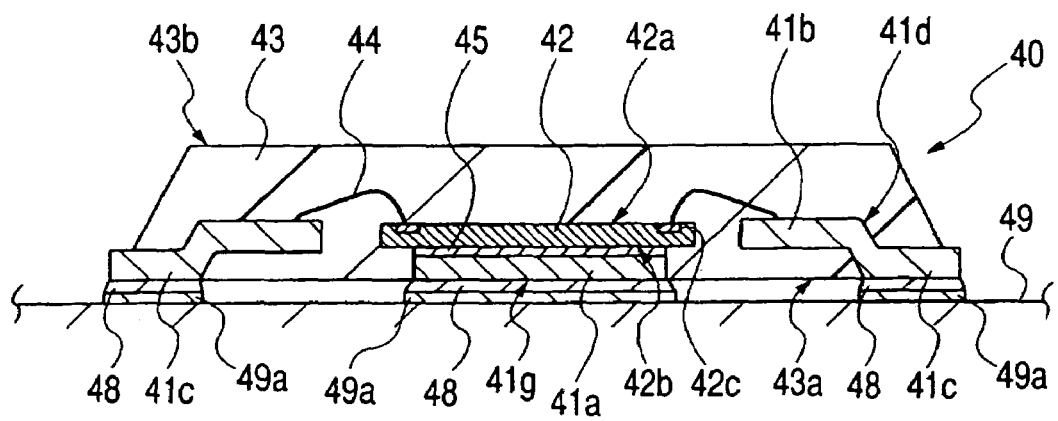
FIG. 27 is a partial sectional view showing an example of a mounted state of the QFN illustrated in FIG. 16 onto a mounting substrate.
Figure 28:
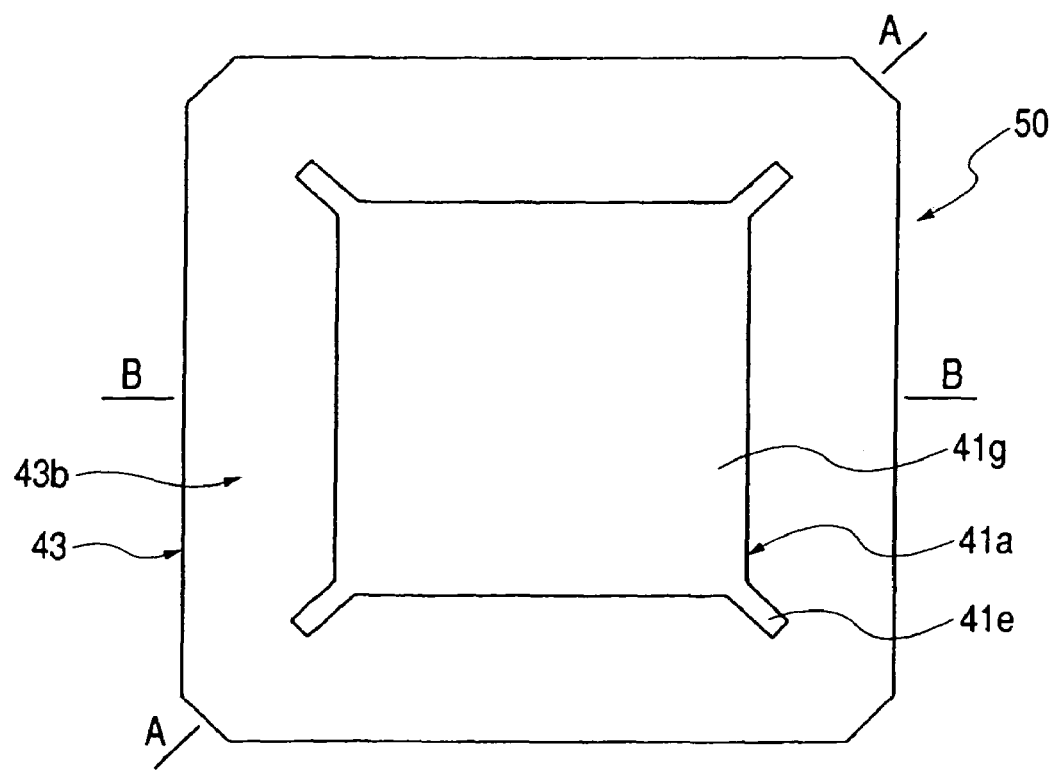
FIG. 28 is a plan view showing a structure of a QFN according to a modification of the sixth embodiment.
Figure 29:
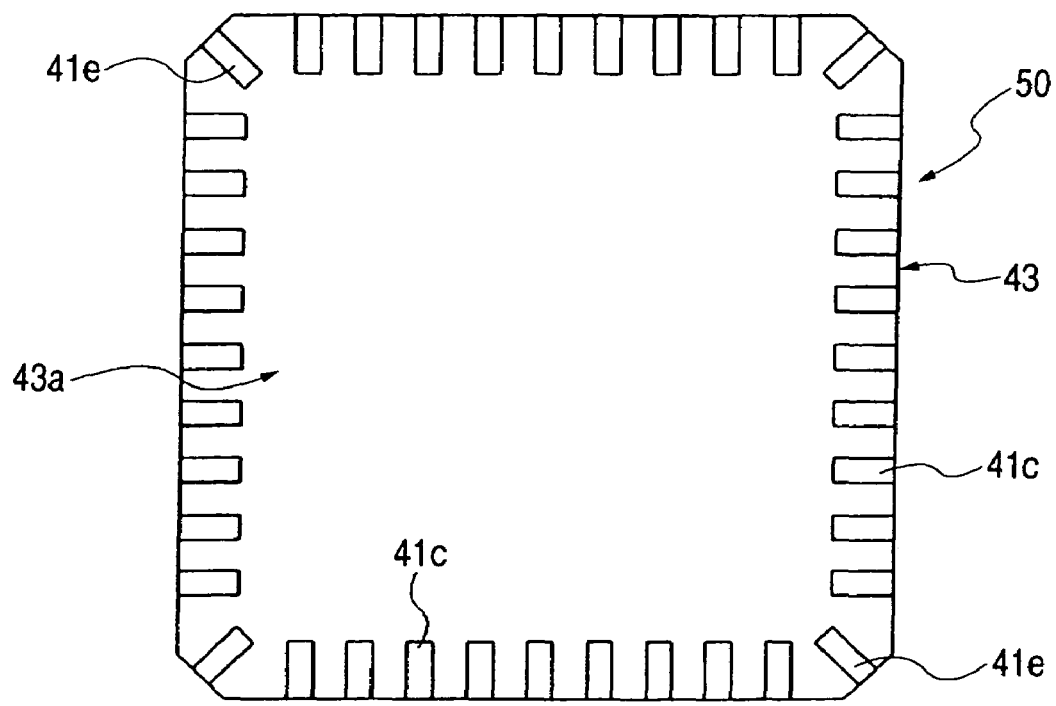
FIG. 29 is a bottom view showing a structure of the QFN illustrated in FIG. 28.
Figure 30:
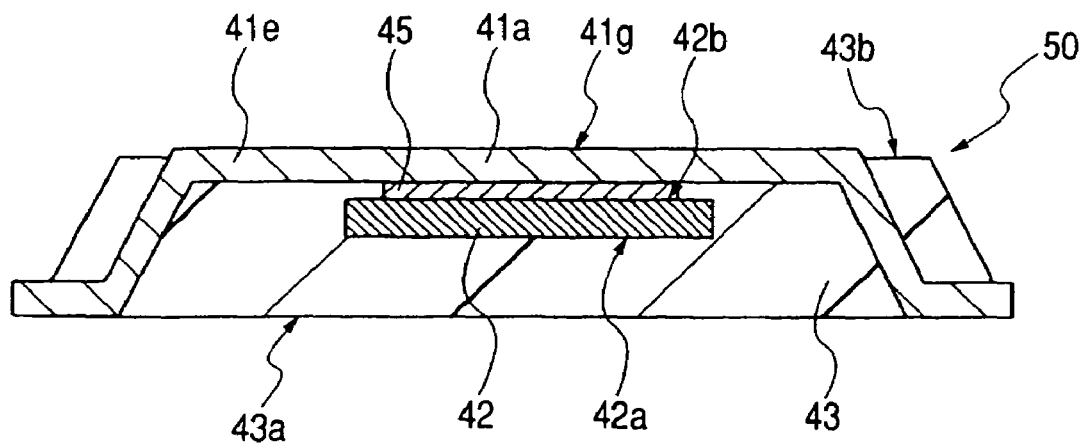
FIG. 30 is a sectional view showing a structure taken along line A-A in FIG. 28.
Figure 31:
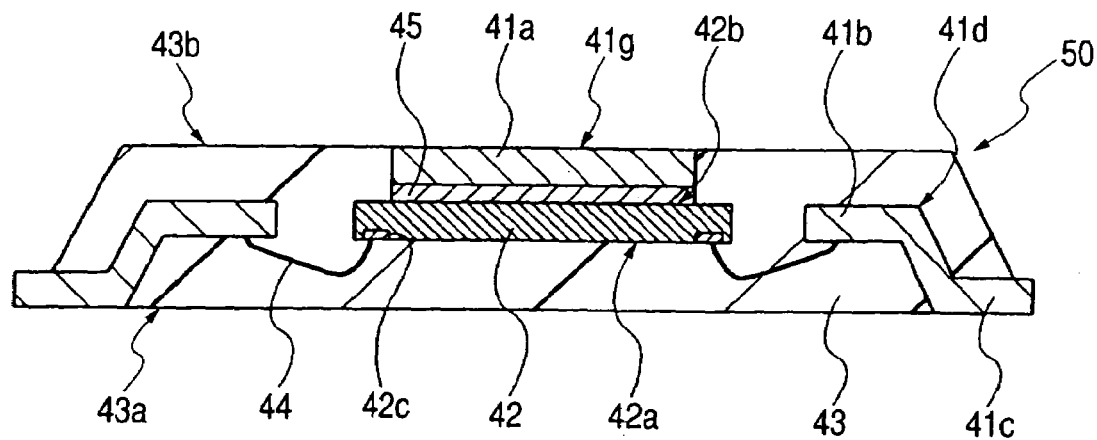
FIG. 31 is a sectional view showing a structure taken along line B-B in FIG. 28.
Figure 32:
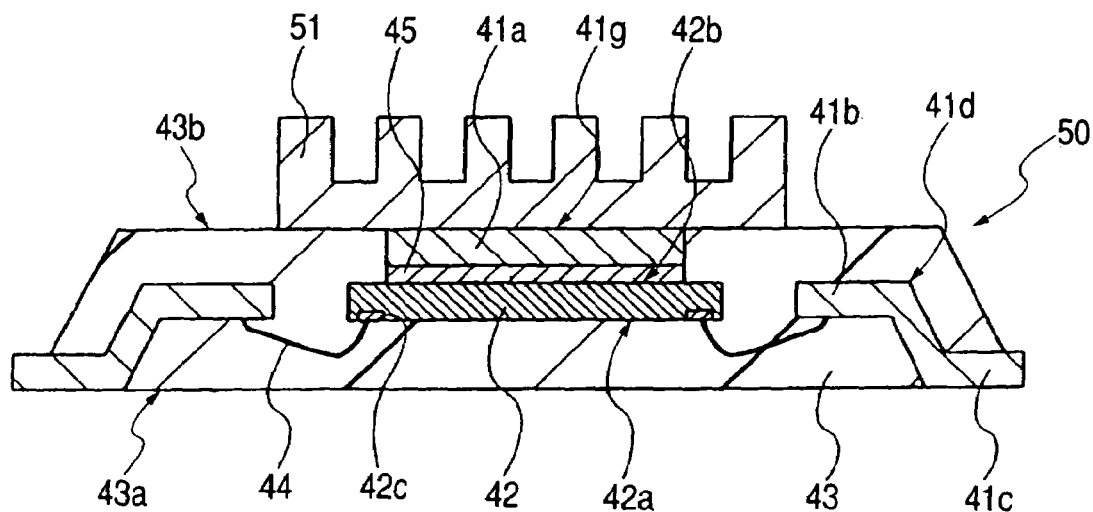
FIG. 32 is a sectional view showing a structure in which a heat radiation fin as an example of a heat sink is attached to the QFN illustrated in FIG. 28.

FIG. 16 is a plan view showing a structural example of a semiconductor device (QFN) according to a sixth embodiment of the present invention, FIG. 17 is a bottom view showing a structure of the QFN illustrated in FIG. 16, FIG. 18 is a sectional view showing a structure taken along line A-A in FIG. 17, FIG. 19 is a sectional view showing a structure taken along line B-B in FIG. 17, FIG. 20 is a construction diagram showing an example of a positional relation between an inverted pyramidal collet and an inner lead portion during die bonding in assembling the QFN illustrated in FIG. 16, FIG. 21 is a construction diagram showing an example of a wire length simulation result in the QFN illustrated in FIG. 16, FIG. 22 is a construction diagram showing an example of a wire length simulation result in a QFN as a comparative example, FIG. 23 is a plan view showing an example of pad array and the magnitude of an additional capacitance in a semiconductor chip incorporated in the QFN illustrated in FIG. 16, FIG. 24 is a partial plan view showing a structural example of a lead frame used in assembling the QFN illustrated in FIG. 16, FIG. 25 is a partial sectional view showing an example of a heated state of a lead during wire bonding in assembling the QFN illustrated in FIG. 16, FIG. 26 is a partial plan view showing a structural example after wire bonding in assembling the QFN illustrated in FIG. 16, FIG. 27 is a partial sectional view showing an example of a mounted state of the QFN illustrated in FIG. 16 onto a mounting substrate, FIG. 28 is a plan view showing a structure of a QFN according to a modification of the sixth embodiment, FIG. 29 is a bottom view showing a structure of the QFN illustrated in FIG. 28, FIG. 30 is a sectional view showing a structure taken along line A-A in FIG. 28, FIG. 31 is a sectional view showing a structure taken along line B-B in FIG. 28, and FIG. 32 is a sectional view showing a structure in which a heat radiation fin as an example of a heat sink is attached to the QFN illustrated in FIG. 28.

The semiconductor device of this sixth embodiment illustrated in FIGS. 16 to 19 is a small-sized and resin-sealed semiconductor package for high frequency which is of a wire bonding type assembled using such a lead frame 41 as shown in FIG. 24. This semiconductor device realizes high-frequency signal transmission at a low cost as a plastic package. In this sixth embodiment, as an example of the semiconductor device, reference will be made below to a non-leaded type QFN (Quad Flat Non-leaded Package) 40.

The QFN 40 is made up of a semiconductor chip 42 which is an LSI (Large Scale Integrated circuit) chip having a semiconductor element and plural bonding pads (electrodes) 42c, a die pad (also called a tub) 41a smaller than a main surface 42a of the semiconductor chip 42 and bonded to a back side 42b of the semiconductor chip, a sealing member 43 which seals the semiconductor chip 42 with resin, plural leads 41d each comprising an outer terminal portion 41c exposed to a mounting surface 43a of the sealing member 43 and an inner lead portion 41b disposed inside the sealing member 43, plural bonding wires 44 for electrically connecting plural bonding pads 42c on the semiconductor chip 42 and plural inner lead portions 41b with each other, and a die bonding material 45 for bonding the die pad 41a and the semiconductor chip 42 with each other. The inner lead portions 41b of the plural leads 41d are each bent in a direction away from the mounting surface 43a of the sealing member 43.

Thus, the QFN 40 is a small-sized semiconductor package of a small tub structure wherein the inner lead portions 41b of the plural leads 41d are each bent inwards of the sealing member 43.

The QFN 40 is a semiconductor package for high frequency and, for the dissipation of heat generated from the semiconductor chip 42 during high-speed operation, it has a heat dissipating structure wherein the die pad 41a bonded to the semiconductor chip 42 is exposed to the mounting surface 43a of the sealing member 43, as shown in FIG. 18.

Further, since the QFN 40 is a semiconductor package for high frequency, it is constructed so as to facilitate attaining impedance matching at various portions of an input/output transmission path of a high-frequency signal. To be more specific, the inner lead portions 41b of the plural leads 41d are bent inwards of the sealing member 43, thereby approximating the height of the chip-side bonding pads 42c and the height at the bonding position of the inner lead portions 41b to each other to shorten the bonding wires 44 insofar as possible, so that an increase in inductance of the wire portions is suppressed and it becomes easier to attain impedance matching at various portions of the high-frequency signal I/O transmission path.

Thus, according to the structure adopted in this embodiment, the distance between a chip end and an end of each inner lead portion is made as short as possible within a range which permits assembly of the package in order to make the bonding wires 44 as short as possible within a range which permits wire bonding.

FIG. 20 shows a relation between a chip end—inner lead portion end distance (R) and an inverted pyramidal collet 46.

First, for minimizing the chip end—inner lead portion end distance (R), it is necessary to enhance the die bonding position accuracy. In this connection, it is preferable to use during die bonding the inverted pyramidal collet 46 as means for chucking and conveying the semiconductor chip 42. As compared with a flat collet, the inverted pyramidal collet 46 permits enhancement of the position accuracy at the time of disposing the semiconductor chip 42 because it supports an outer periphery end of the main surface 42a of the semiconductor chip 42, and with the collet 46 it is possible to obtain a die bonding position accuracy of +0.05 mm.

However, in adopting the inverted pyramidal collet 46 it is necessary that a projection quantity (Q) of an outer periphery end of the collet 46 from the semiconductor chip 42 be made as small as possible to avoid interference of the collet outer periphery end with a tip of each inner lead portion 41b.

To meet this requirement the present inventors have calculated such an inclination angle (θ) of a contact surface 46a of the inverted pyramidal collet 46 as minimizes the projection quantity (Q) within a range which permits chucking and holding of the semiconductor chip 42. As a result, the inclination angle θ was found to be 45° or less.

If the angle (the aforesaid inclination angle θ) between the contact surface 46a of the inverted pyramidal collet 46 which surface comes into contact with the semiconductor chip 42 at the time of chucking the chip and a vertical axis 46b of the collet 46 is set at 45° or less, the projection quantity (Q) of the collet 46 can be made small. But if the angle θ is set much smaller than 45°, the chip chucking force will be weakened, so it is preferable to set the inclination angle (θ) at 45°.

For example, if the inclination angle (θ) is set at 45° C., the distance (Q) between a chip end and an outer periphery end of the inverted pyramidal collet can be made equal to 0.13 mm.

The accuracy of a tip position of each inner lead portion 41b is ±0.025 mm and the die bonding position accuracy is ±0.05 mm, so that, if the distance from an outer periphery end of the inverted pyramidal collet 46 to the tip of the inner lead portion 41b is assumed to be (P), a minimum size required as (P) is P=0.025 mm+0.05 mm=0.075 mm.

Further, the chip end—inner lead portion end distance (R) is (R)=(Q)+(P), i.e., (R)=0.13 mm+0.075 mm=0.205 mm.

Thus, it is found difficult to make the distance (R) narrower than 0.205 mm, and therefore a minimum value of the distance (R) is set at 0.205 mm as an example.

In the QFN 40 of this sixth embodiment, for the purpose of making the bonding wires 44 as short as possible, the inner lead portions 41b are bent upward (away from the mounting surface 43a of the sealing member 43) so that the height of the bonding pads 42c on the semiconductor chip 42 and that of the bonding position of the inner lead portions 41b come closer to each other. In such a state, the length of each bonding wire 44 has been determined by simulation, the result of which is illustrated in FIG. 21.

As to the simulation illustrated in FIG. 21, it is assumed that a planar length (projection length to a plane) of each bonding wire 44 is (S), the height is (T), the length of an inclined portion is (U), a target value of the planar length of the bonding wire 44 is 0.4 mm or less, and a target value of an actual length is 0.65 mm or less, further, conditions such as the impedance of the high frequency signal transmission path and the capacity of microstrip lines in the semiconductor chip 42 are established, and simulation is performed under these conditions. As a result of the simulation, the planar length (S) and the actual length (T+U) are 0.385 mm and 0.617 mm, respectively, both falling under the target value ranges.

Thus, as an example, it is desirable that the length of each bonding wire 44 be set at 0.65 mm or less.

FIG. 22 represents a simulation of a case where each inner lead portion 41b is not bent, as an example comparative with FIG. 21. More specifically, a die pad 41a and an inner lead portion 41b are arranged at the same height and thus the height of a bonding position of the inner lead portion 41b is much lower than the position of each bonding pad 42c on a semiconductor chip 42.

In the simulation shown as an comparative example in FIG. 22, the length (U) of an inclined portion is 0.562 mm and an actual length (T+U) is 0.762 mm, which is largely outside the actual length target value of 0.65 mm or less.

Thus, it is seen that bending the inner lead portion 41b is very effective in facilitating impedance matching in a package for a semiconductor device which operates at a high speed.

The QFN 40 is a semiconductor package of a small tub structure.

According to this structure, the size of the die pad 41a is smaller than the main surface 42a of the semiconductor chip 42, and the die pad 41a is retracted from an outer periphery portion of the semiconductor chip 42.

Consequently, as shown in FIG. 25, it is possible to ensure a positional margin 47a between a heat block 47 and the die pad 41a during wire bonding and hence possible to prevent interference between the heat block 47 and the die pad 41a during wire bonding.

Moreover, because of the small tub structure, also in machining the lead frame 41 shown in FIG. 24 it is possible to ensure a margin at the time of bending each inner lead portion 41b.

Further, as shown in FIG. 17, the die pad 41a of QFN 40 is supported at its four corners by suspension leads 41e, and such concave portions 41f as shown in FIG. 18 are formed respectively in mounting-side surfaces of the suspension leads 41e at positions adjacent to outer terminal portions 41c.

In the sealing step with an insulating resin, the insulating resin gets into the concave portions 41f, and in the mounting surface 43a of the sealing member 43, as shown in FIG. 17, portions of the suspension leads 41e adjacent to both-side outer terminal portions 41c are hidden into the sealing resin.

According to this structure, when the QFN 40 is soldered onto a mounting substrate 49, as shown in FIG. 27, it is possible to prevent solder short between each suspension lead 41e and outer terminal portions 41c adjacent thereto.

In the QFN 40 of this sixth embodiment, if the transmission of a high-frequency signal of 10 GHz, for example, is to be attained, it is difficult by a mere shortening of the bonding wires 44, so there is adopted such a semiconductor chip 42 with microstrip lines formed thereon as described in the first embodiment illustrated in FIGS. 1 to 3.

In this case, the semiconductor chip 42 has a first-layer wiring (first wiring) connected electrically to the ground potential, an interlayer insulating film (first insulating film) 15 formed on the first-layer wiring 11, and a fourth-layer wiring (second wiring) 14A formed on the interlayer insulating film 15 and serving as a signal transmission line. The fourth-layer wiring 14A includes a first region CAPA, a second region 31, and a third region. The second region 31 of the fourth-layer wiring 14A is positioned between the first region CAPA and the third region, bonding wires 44 are connected to the first region CAPA of the fourth-layer wiring 14A, and the wiring width in the second region 31 of the fourth-layer wiring 14A is larger than that in the third region.

Thus, by using the semiconductor chip 42 with a microstrip line formed thereon and making the bonding wires 44 as short as possible to suppress an increase in inductance of the wire portions, it becomes possible to take impedance matching at various portions of the high-frequency signal I/O transmission path.

That is, it is possible to match the impedance in the semiconductor chip 42, the impedance in the wire portions, the impedance in the leads 41d, and the impedance in terminals 49a (see FIG. 27) of the mounting substrate 49. For example, the respective impedances are all set to 50 Ω, whereby it is possible to eliminate reflection of a high-frequency signal and prevent noise from remaining in the signal.

Moreover, by suppressing an increase in inductance of the bonding wires 44 to diminish the capacitance which is added for impedance matching, it is possible to suppress a loss of a high-frequency signal at output.

FIG. 23 shows an example of pad layout of the semiconductor chip 42 for 36 pins, of which 4 pins are used as high-frequency signal terminals. In FIG. 23, the bonding pads 42c each formed with an additional capacitance 42g are pads for high frequency. In the same figure, the four pads for high frequency arranged in the left-hand column are for input, while the four pads for high frequency arranged in the right-hand column are for output.

Among the 36 pads shown in FIG. 23, oblique-lined pads are pads 42d for AC signal, dotted pads are pads 42e for AC ground, and white pads are pads 42f for DC, and the size of an arrow of additional capacitance 42g attached to each associated pad represents the magnitude of capacitance.

Line impedance Z can be written simply as $Z=(L/C)^{1/2}$, assuming that inductance is L and capacitance is C.

In the QFN 40 of this sixth embodiment, the capacitance (C) for matching the impedance (Z) is slightly changed according to the length of each bonding wire 44 to change the capacitance of the microstrip lines on the chip. To be more specific, as shown in FIG. 26, in each wire row along each side, the closer to corners, the larger the wire length, which is ascribable to the arrangement of tips of the inner lead portions 41b.

In the QFN 40, therefore, the area of CAPA (first region) of the fourth-layer wiring (second wiring) 14A on the first-layer wiring (first wiring) 11 shown in FIG. 1 is changed according to the length of each bonding wire 44 to change the magnitude of an internal capacitance of the chip. In this way it becomes possible to take impedance matching of plural lines.

In the pad layout of the semiconductor chip 42, as shown in FIG. 23, output electrodes (the pads 42d for AC signal in the right-hand column) for high-speed signals are arranged at positions opposed to input electrodes (the pads 42d for AC signal in the left-hand column) for high-speed signals.

By thus arranging the input- and output-side high-speed signal pads it is possible to make the flow of signal smooth and suppress a loss on the output side.

The leads 41d and die pad 41a of QFN 40 in this sixth embodiment are formed of a copper alloy 0.2 mm thick for example, and the sealing member 43 is formed of an epoxy resin such as a thermosetting resin for example.

Further, the bonding wires 44 are gold wires for example.

The following description is now provided about a method of manufacturing the QFN 40 according to this sixth embodiment.

First, the lead frame 41 shown in FIG. 24 is provided, the lead frame 24 having a die pad 41a smaller than the main surface 42a of the semiconductor chip 42 and plural leads 41d each comprising an outer terminal portion 41c and an inner lead portion 41b, the inner lead portion 41b being bent in a direction away from the surface on which the outer terminal portions 41c are arranged.

On the other hand, the semiconductor chip 42 having a semiconductor element and plural bonding pads 42c is provided.

As the semiconductor chip 42 there is used one in which microstrip lines comprising such a first-layer wiring (first wiring) 11 as shown in FIG. 1, a fourth-layer wiring 14A and interlayer insulating films (first insulating film) 15 sandwiched in between the first- and fourth-layer wirings 11, 14A are provided in such high-frequency signal pads (AC signal pads 42d) as shown in FIG. 23.

In the semiconductor chip 42, the area of the first region CAPA of the fourth-layer wiring 14A on the first-layer wiring 11 shown in FIG. 1 is changed according to the length of each bonding wire 44 to change the magnitude of an internal capacitance of the chip, thereby attaining impedance matching of each line.

That is, in the bonding pads 42c on the semiconductor chip 42 are included high-frequency signal pads (AC signal pads 42d) each connected to a microstrip line formed with such an additional capacitance 42g as shown in FIG. 23, and for impedance matching, the magnitude of the additional capacitance 42g also differs pad by pad in accordance with the length of each bonding wire 44 connected thereto.

Therefore, in a pad column along one side, bonding pads 44 located close to a central part are shorter due to a relation to the distance from the tips of inner lead portions 41b, and the magnitude of the additional capacitance 42g required is relatively small, while pads located close to corners are longer and hence the magnitude of the additional capacitance 42g required is larger.

Further, output-side high-frequency signal pads are arranged at positions opposed to input-side high-frequency signal pads so as to make the flow of high-frequency signals smooth.

Thereafter, the semiconductor chip 42 is protruded from the die pad 41a and there is performed die bonding for bonding the back side 42b of the semiconductor chip 42 and the die pad 41a with each other.

At this time, the semiconductor chip 42 is chucked and held on the die pad 41a with use of an inverted pyramidal collet 46 having an inclination angle of a contact surface 46a of not larger than 45°, whereby not only the positional accuracy in die bonding can be kept to ±0.05 mm, but also, as shown in FIG. 20, the inverted pyramidal collet 46 can be moved vertically without interference of its outer periphery end with the tip of each inner lead portion 41b.

The semiconductor chip 42 is bonded onto the die pad 41a through a die bonding material 45.

Subsequently, wire bonding is carried out in which the bonding pads 42c on the semiconductor chip 42 and corresponding inner lead portions 41b of the lead frame 41 are connected together electrically through bonding wires 44 as shown in FIG. 26.

In this connection, as shown in FIG. 25, the QFN 40 is of a small tub structure wherein the size of the die pad 41a is smaller than the main surface 42a of the semiconductor chip 42, so when the die pad 41a and the leads 41d are arranged on the heat block 47, the die pad 41a assumes a retracted state from the outer periphery portion of the semiconductor chip 42 and thus it is possible to ensure a positional margin 47a between the heat block 47 and the die pad 41a.

Consequently, it is possible to prevent interference between the heat block 47 and the die pad 41a during wire bonding.

As shown in FIG. 26, the bonding wires 44 become longer toward corners in each wire row due to a difference in tip position of the inner lead portions 41b.

Therefore, as shown in FIG. 23, it is preferable that the high-frequency signal pads (AC signal pads 42d) be not present near the corners of the semiconductor chip 42, and for taking impedance matching in each transmission path, it is necessary that, among the high-frequency pads (AC signal pads 42d), those positioned near the corners be set larger in additional capacitance 42g.

Thereafter, sealing is performed using resin to form a sealing member 43.

The resin sealing is performed along a molding line 41h shown in FIG. 24.

In this case, the semiconductor chip 42, the bonding wires 44 and the plural inner lead portions 41b are resin-sealed in such a manner that the outer terminal portions 41c of plural leads 41d and a back side 41g of the die pad 41a are exposed to a mounting surface 43a of the sealing member 43 and that the inner lead portions 41b are arranged inside.

Thereafter, the plural leads 41d and suspension leads 41e are cut off from a frame portion 41j of the lead frame 41 to complete assembly of the QFN 40.

Next, reference will be made below to a structure for mounting the QFN 40 onto the mounting substrate 49, which is shown in FIG. 27.

A large quantity of heat is generated from the semiconductor chip 42 which processes a high-frequency signal. The heat is dissipated through the back side 41g of the die pad 41a exposed to the mounting surface 43a of the sealing member 43.

More specifically, the outer terminal portions 41c exposed to the mounting surface 43a of the sealing member 43 are connected to terminals 49a of the mounting substrate 49 through solder 48, while the back side 41g of the die pad 41a exposed to the mounting surface 43a of the sealing member 43 is connected to the terminals 49a of the mounting substrate 49 through the solder 48.

As a result, in the QFN 40, the heat can be allowed to escape from the mounting surface 43a of the sealing member 43 to the mounting substrate 49.

According to the QFN 40 of this sixth embodiment, by adopting the semiconductor chip 42 having additional capacitances 42g as capacitances of microstrip lines connected to the high-frequency signal pads (AC signal pads 42d), it is possible to compensate an increase of inductance caused by the bonding wires 44, and for impedance matching, the length of each bonding wire 44 is made as small as possible, whereby an increase in inductance of the wire portions can be suppressed and it is possible to minimize a capacitance (ΔC) formed by intra-chip microstrip lines which are for impedance matching at various portions of the high-frequency signal I/O transmission path.

As a result, the loss of an output signal based on wiring capacitance can be made small and there can be realized a small-sized, inexpensive, resin-sealed type QFN 40 (high-speed LSI) for high frequency using bonding wires 44.

In the structure of this sixth embodiment, plural outer terminal portions 41c are exposed to the mounting surface 43a of the sealing member 43, so in comparison with, for example, a QFP (Quad Flat Package) having outer terminal portions exposed from an outer periphery of a sealing member, signal transmission lines from the connections between the bonding wires 44 and the inner lead portions 41b up to the outer terminal portions 41c can be made shorter and thus it is possible to suppress an increase of impedance.

Next, a description will be given below about a modification of this sixth embodiment.

FIGS. 28 to 31 illustrate the structure of a semiconductor device according to a modification of the sixth embodiment, which semiconductor device is a small-sized, inexpensive, resin-sealed type QFN 50 for high frequency using bonding wires 44.

As shown in FIGS. 28 and 31, the QFN 50 is different from the QFN 40 in that a back side 41g of a die pad 41a is exposed to a surface 43b opposite to a mounting surface 43a of a sealing member 43.

Therefore, as shown in FIG. 29, on the mounting surface 43a side of the sealing member 43 are exposed only plural outer terminal portions 41c and part of suspension leads 41e.

By thus exposing the die pad 41a to the surface 43b side of the sealing member 43, various heat dissipating and cooling members can be attached directly to the exposed portion (back side 41g) of the die pad 41a, so that the heat dissipating performance can be further improved in comparison with the QFN 40 in which the die pad 41a is exposed to the mounting surface 43a of the sealing member 43.

It is FIG. 32 that shows a mounted state of a heat radiation fin 51 as an example of the aforesaid heat dissipating member, or a heat sink. As the heat dissipating or cooling member there may be mounted a cooling pipe or a cooling jacket other than the heat radiation fin 51.

Further, by exposing the die pad 41a to the surface 43b side of the sealing member 43, substrate-side terminals 49a for connection with the die pad 41a as in the QFN 40 are not required to be formed on the mounting substrate 49. Consequently, it is possible to not only improve the freedom of wiring layout on the mounting substrate 49, but also improve the packaging density of the mounting substrate 49.

As to the other effects obtained by the QFN 50, they are the same as in the case of QFN 40 and therefore a repeated explanation thereof will here be omitted.

Seventh Embodiment

Figure 33:
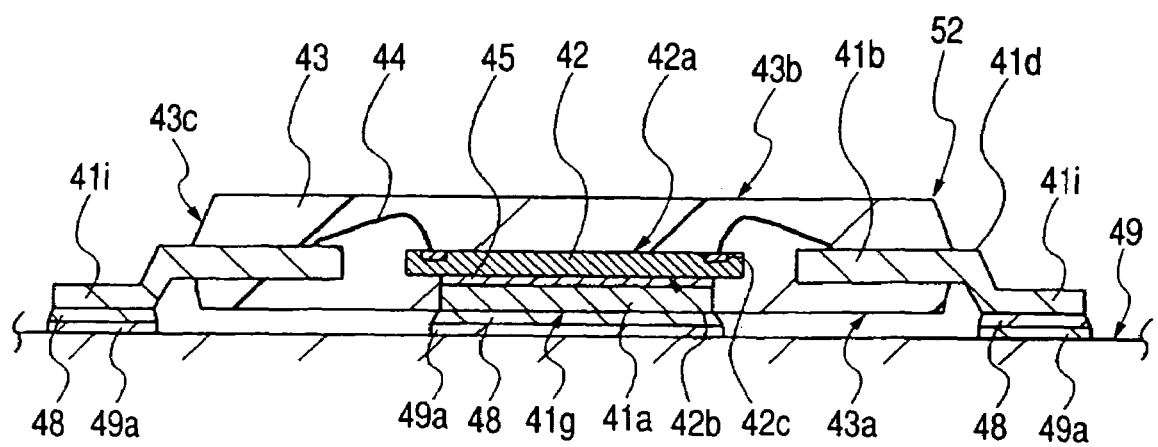
FIG. 33 is a partial sectional view showing an example of a mounted state of a semiconductor device (QFP) according to a seventh embodiment of the present invention onto a mounting substrate.

FIG. 33 is a partial sectional view showing an example of a mounted state of a semiconductor device (QFP) according to a seventh embodiment of the present invention onto a mounting substrate.

The semiconductor device of this seventh embodiment shown in FIG. 33 is a wire bonding type and resin-sealed type semiconductor package for high frequency. As is the case with QFN 40 of the sixth embodiment, the semiconductor package of this seventh embodiment realizes, as a plastic package, the transmission of a high-frequency signal at a low cost. In this seventh embodiment, as an example of the semiconductor device, reference will be made below to a QFP (Quad Flat Package) 52.

The QFP 52 comprises a semiconductor chip 42 having a semiconductor element and plural bonding pads 42c, a die pad 41a smaller than a main surface 42a of the semiconductor chip 42 and bonded to a back side 42b of the semiconductor chip, a sealing member 43 which seals the semiconductor chip 42 with resin, plural leads 41d, the leads 41d each comprising an outer lead 41i as an outer terminal portion exposed to the exterior from a side face 43c of the sealing member 43 and an inner lead portion 41b disposed inside the sealing member 43, and plural bonding wires 44 electrically connected respectively to both plural bonding pads 42c on the semiconductor chip 42 and the plural inner lead portions 41b.

As shown in FIGS. 1 to 3, the semiconductor chip 42 incorporated in the QFP 52 has a first-layer wiring (first wiring 11) connected electrically to the ground potential, interlayer insulating films (first insulating films) 15 formed on the first-layer wiring 11, and a fourth-layer wiring (second wiring) 14A formed on the interlayer insulating film 15 and serving as a signal transmission line. The fourth-layer wiring 14A includes a first region CAPA, a second region 31 and a third region. The second region 31 of the fourth-layer wiring 14A is positioned between the first region CAPA and the third region. The bonding wires 44 are connected to the first region CAPA of the fourth-layer wiring 14A, and the wiring width in the second region 31 of the fourth-layer wiring 14A is set larger than that in the third region.

Also in this seventh embodiment, the outer leads 41i of the leads 41d are formed with portions which are bent in a direction away from their arranged surface, so that the height of bonding pads 42c on the semiconductor chip 42 and the height at the bonding position of the inner lead portions 41b can be made close to each other, whereby it is possible to minimize the length of each bonding wire 44 in a bondable range. As a result, it is possible to diminish an increase in inductance of the wire portions. Moreover, by using the semiconductor chip 42 formed with microstrip lines, it is possible to attain impedance matching at various portions of an input/output transmission path for a high-frequency signal of 10 GHz, for example.

Thus, also in the QFP 52 of this seventh embodiment it is possible to obtain the same functions and effects as in the QFN 40 of the sixth embodiment.

Further, as is the case with the QFN 50 of the sixth embodiment, by exposing a back side 41g of the die pad 41a to a surface 43b side opposite to a mounting surface 43a of the sealing member 43, it is possible to not only further improve the heat dissipating characteristic of the QFP 52 but also improve the packaging density of a mounting substrate 49.

A main procedure for assembling the QFP 52 is almost the same as the assembling procedure for the QFN 40 of the sixth embodiment and it goes without saying that the use of such an inverted pyramidal collet 46 as shown in FIG. 20 in die bonding is preferred.

Although the present invention has been described above concretely by way of embodiments thereof, it is needless to say that the invention is not limited to the above embodiments, but that various changes may be made within the scope not departing from the gist of the invention.

Although in the above embodiments two-layers of wirings are formed between the first- and fourth-layer wirings, they may be substituted by wirings of one, three, or more layers.

Further, although in the seventh embodiment the portions of the leads 41d in the QFP 52, which portions are bent in a direction away from the arranged surface of the outer leads 41i, are positioned in the outer leads 41i outside the sealing member 43, the bent portions may be formed at any position in the region from the outer leads 41i to the inner lead portions 41b. For example, they may be formed in only the inner lead portions 41b.

The following is a brief description of effects obtained by typical modes of the present invention as disclosed herein.

(1) The first wiring connected electrically to the ground potential and the second wiring serving as pads for connection with bonding wires are used as capacitance electrodes and the first insulating film located between the first and the second wiring is used as a capacitance insulating film to constitute a capacitance component, and therefore also in case of forming by the wire bonding method a package on which is mounted a semiconductor chip with a high-speed LSI formed thereon, it is possible to attain characteristic impedance matching of signal transmission lines in the package.

(2) Since the inner lead portions are bent in a direction away from the mounting surface of the sealing member, it is possible to shorten the bonding wires. Consequently, it is possible to suppress an increase in inductance of the wire portions and diminish a capacitance formed by intra-chip microstrip lines which are for attaining impedance matching at various portions of an input/output transmission path of a high-frequency signal. As a result, it is possible to diminish an output signal loss based on wiring capacitance and realize a small-sized, inexpensive, resin-sealed type semiconductor device for high frequency using bonding wires.

What is claimed is:

1. A method of manufacturing a semiconductor device assembled by using a lead frame, comprising the steps of:
    (a) providing a lead frame, the lead frame having a die pad smaller than a main surface of a semiconductor chip and a plurality of leads each comprising an outer terminal portion and an inner lead portion, the inner lead portions of the leads being bent in a direction away from a surface on which the outer lead portions of the leads are arranged;
    (b) providing the semiconductor chip, the semiconductor chip having a semiconductor element and a plurality of electrodes;
    (c) protruding the semiconductor chip from the die pad and bonding a back side of the semiconductor chip and the die pad with each other;
    (d) connecting the electrodes of the semiconductor chip and corresponding said inner lead portions of the lead frame electrically with each other through bonding wires;
    (e) sealing the semiconductor chip, the bonding wires and the plural inner lead portions with resin to form a sealing member in such a manner that the outer terminal portions of the leads are exposed to a mounting surface of the sealing member and that the inner lead portions of the leads are disposed inside the sealing member; and separating the plural leads from the lead frame,
    wherein the semiconductor chip provided in the step (b) comprises:
    a first wiring formed on a semiconductor substrate and connected electrically to a ground potential;
    a first insulating film formed on the first wiring; and
    a second wiring formed on the first insulating film and serving as a signal transmission line,
    the second wiring including a first region, a second region, and a third region,
    the second region of the second wiring being positioned between the first region and the third region,
    with bonding wires being connected to the first region of the second wiring, and
    the width of the second wiring in the second region being larger than the width thereof in the third region.

2. A method according to claim 1, wherein the area of the first region of the second wiring on the first wiring in the semiconductor chip is changed according to the length of each of the bonding wires to change an internal capacitance of the chip.

3. A method according to claim 1, wherein, in the semiconductor chip, output electrodes for a high-speed signal are arranged at positions opposed to input electrodes for a high-speed signal.

4. A method of manufacturing a semiconductor device assembled by using a lead frame, comprising the steps of:
    (a) providing a lead frame, the lead frame having a die pad and a plurality of leads each comprising an outer terminal portion and an inner lead portion, the inner lead portions of the leads being bent in a direction away from a surface on which the outer terminal portions of the leads are arranged;
    (b) providing a semiconductor chip having a semiconductor element and a plurality of electrodes;
    (c) bonding a back side of the semiconductor chip and the die pad with each other;
    (d) connecting the electrodes of the semiconductor chip and corresponding said inner lead portions of the lead frame electrically with each other through bonding wires;
    (e) sealing the semiconductor chip, the bonding wires and the plural inner lead portions with resin to form a sealing member in such a manner that the outer terminal portions of the leads are exposed to a mounting surface of the sealing member and that the inner lead portions of the leads are disposed inside the sealing member; and
    (f) separating the plural leads from the lead frame,
    the semiconductor chip comprising:
    a first wiring formed on a semiconductor substrate and connected electrically to a ground potential;
    a first insulating film formed on the first wiring; and
    a second wiring formed on the first insulating film and serving as a signal transmission line, the second wiring including a first region, a second region and a third region, the second region of the second wiring being positioned between the first region and the third region, with bonding wires being connected to the first region of the second wiring, and the width of the second wiring in the second region being larger than the width thereof in the third region.

5. A method of manufacturing a semiconductor device assembled by using a lead frame, comprising the steps of:

(a) providing a lead frame, the lead frame having a die pad smaller than a main surface of a semiconductor chip and a plurality of leads each comprising an outer terminal portion and an inner lead portion, at least one of each said outer terminal portion and each said inner lead portion having a portion bent in a direction away from a surface on which the outer terminal portions are arranged;

(b) providing the semiconductor chip, the semiconductor chip having a semiconductor element and a plurality of electrodes;

(c) protruding the semiconductor chip from the die pad and bonding a back side of the semiconductor chip and the die pad with each other;

(d) connecting the electrodes of the semiconductor chip and corresponding said inner lead portions of the lead frame electrically with each other through bonding wires;

(e) sealing the semiconductor chip, the bonding wires and the plural inner leads with resin to form a sealing member in such a manner that the outer terminal portions of the leads are exposed to the exterior from side faces of the sealing member and that the inner lead portions of the leads are disposed inside the sealing member; and (f) separating the plural leads from the lead frame, the semiconductor chip comprising:

a first wiring formed on a semiconductor substrate and connected electrically to a ground potential;

a first insulating film formed on the first wiring; and a second wiring formed on the first insulating film and serving as a signal transmission line, the second wiring including a first region, a second region and a third region, the second region of the second wiring being positioned between the first region and the third region, with bonding wires being connected to the first region, and the width of the second wiring in the second region being larger than the width thereof in the third region.

6. A method according to claim 5, wherein the sealing with resin is performed in such a manner that the die pad is exposed to a surface opposite to a mounting surface of the sealing member.

* * * * *